United States Patent
Seidel et al.

(10) Patent No.: US 10,644,099 B1
(45) Date of Patent: May 5, 2020

(54) THREE-DIMENSIONAL (3D) METAL-INSULATOR-METAL CAPACITOR (MIMCAP) AND METHOD

(71) Applicant: GLOBALFOUNDRIES INC., Grand Cayman (KY)

(72) Inventors: Robert V. Seidel, Dresden (DE); Thomas G. McKay, Boulder Creek, CA (US); Tibor Bolom, Litomerice (CZ)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/168,951

(22) Filed: Oct. 24, 2018

(51) Int. Cl.
*H01L 23/522* (2006.01)
*H01L 27/108* (2006.01)
*H01L 29/66* (2006.01)
*H01L 49/02* (2006.01)
*H01L 21/768* (2006.01)

(52) U.S. Cl.
CPC .......... *H01L 28/91* (2013.01); *H01L 21/7687* (2013.01); *H01L 21/76813* (2013.01); *H01L 23/5223* (2013.01); *H01L 28/75* (2013.01)

(58) Field of Classification Search
CPC .......................... H01L 27/108; H01L 23/5223
See application file for complete search history.

(56) References Cited

U.S. PATENT DOCUMENTS

| | | | |
|---|---|---|---|
| 5,635,423 | A | 6/1997 | Huang et al. |
| 6,960,365 | B2 | 11/2005 | Ning |
| 7,186,625 | B2 | 3/2007 | Chudzik et al. |
| 8,741,732 | B2 | 6/2014 | Wu et al. |
| 2002/0155676 | A1 | 10/2002 | Stetter et al. |

(Continued)

OTHER PUBLICATIONS

Neve et al., "High-Density and Low-Leakage Novel Embedded 3D MIM Capacitor on Si Interposer," IEEE International 3D Systems Integration Conference (3DIC), 2016, pp. 1-4.

(Continued)

*Primary Examiner* — Julio J Maldonado
*Assistant Examiner* — Omar F Mojaddedi
(74) *Attorney, Agent, or Firm* — Gibb & Riley, LLC; Anthony J. Canale

(57) ABSTRACT

Disclosed are integrated circuit (IC) structure embodiments with a three-dimensional (3D) metal-insulator-metal capacitor (MIMCAP) in back-end-of-the-line (BEOL) metal levels. The MIMCAP includes a plurality of high aspect ratio trenches that extend through at least one relatively thick dielectric layer within the metal levels. Conformal layers of a metal, an insulator and another metal line the trenches and cover the top of the dielectric layer in the area of the MIMCAP. Different configurations for the bottom and top electrode contacts can be used including, for example, one configuration where the top electrode contact is a dual-damascene structure within an ultra-thick metal (UTM) level above the MIMCAP and another configuration where both the top and bottom electrode contacts are such dual-damascene structures. Also disclosed are method embodiments for forming IC structures with such a MIMCAP and these method embodiments can be readily integrated into current BEOL processing, including UTM-level dual-damascene processing.

21 Claims, 30 Drawing Sheets

(56) References Cited

U.S. PATENT DOCUMENTS

| | | | |
|---|---|---|---|
| 2002/0182794 A1 | 12/2002 | Ning et al. | |
| 2003/0073282 A1 | 4/2003 | Ning | |
| 2003/0183862 A1* | 10/2003 | Jin | H01L 23/5223 257/301 |
| 2006/0197183 A1* | 9/2006 | Yang | H01L 28/75 257/532 |
| 2007/0069384 A1* | 3/2007 | Watanabe | H01L 23/5223 257/758 |
| 2007/0111430 A1 | 5/2007 | Chudzik et al. | |
| 2017/0098606 A1 | 4/2017 | Lu et al. | |
| 2017/0148869 A1 | 5/2017 | Detalle | |
| 2017/0194418 A1* | 7/2017 | Papavasiliou | H01L 23/53228 |

OTHER PUBLICATIONS

Polakowski et al., "Ferroelectric Deep Trench Capacitors Based on Al:HfO2 for 3D Nonvolatile Memory Applications," IEEE 6th International Memory Workshop (IMW), 2014, pp. 1-4.

Cremer et al., "High Performances 3D Damascene MIM Capacitors Integrated in Copper Back-End Technologies," IEEE Biplolar/BiCMOS Circuits and Technology Meeting, 2006, pp. 1-4.

Lin et al., "Physical and Electrical Characterization of 3D Embedded Capacitor: A High-Density MIM Capacitor Embedded in TSV," IEEE 67th Electronic Components and Technology Transfer Conference, 2017, pp. 1956-1961.

Lisiansky et al., "Metal-Insulator-Metal (MIM) Capacitors for Mixed Signal/CMOS, PM and RFCMOS Applications," ResearchGate, Tower Jazz Technical Journal, vol. 5, 2014, pp. 30-41.

Mu et al., "High-Performance MIM Capacitors for a Secondary Power Supply Application," MDPI, Micromachines, vol. 9, Issue 69, 2018, pp. 1-10.

\* cited by examiner

THREE-DIMENSIONAL (3D) METAL-INSULATOR-METAL CAPACITOR (MIMCAP) AND METHOD

BACKGROUND

Field of the Invention

The present invention relates to metal-insulator-metal capacitors (MIMCAPs) and, particularly, to a three-dimensional (3D) metal-insulator-metal capacitor (MIMCAP) and a method of forming the 3D MIMCAP.

Description of Related Art

More specifically, smart or connected computing devices (referred to in the art as the internet of things (IoT) devices) are becoming more and more popular in the marketplace. Furthermore, there is an ever-increasing demand for IoT devices to be smaller in size and to have a longer lasting battery life. Power management of such devices, thus, requires capacitors with high capacitance densities. Those skilled in the art will recognize that capacitance density refers to capacitance per chip surface area consumed by the capacitor(s) (e.g., in units of femtofarads (fF)/micrometer squared ($\mu m^2$)). Unfortunately, high capacitance density (e.g., approaching approximately 100 $fF/\mu m^2$ or higher) cannot be achieved with conventional planar dual-electrode or triple-electrode metal-insulator-metal capacitors (MIMCAPs). Furthermore, while some three-dimensional (3D) MIMCAP structures have been developed to provide increased capacitance density, techniques for manufacturing these 3D MIMCAPS are not readily integrated into current process flows and may be deemed cost-prohibitive.

SUMMARY

In view of the foregoing, disclosed herein are embodiments of an integrated circuit (IC) structure, which includes a three-dimensional (3D) metal-insulator-metal capacitor (MIMCAP) that is incorporated into the back-end-of-the-line (BEOL) metal levels to provide increased capacitance density. The MIMCAP can include a plurality of high aspect ratio trenches that extend essentially vertically through dielectric layer(s) within a lower portion of an ultra-thick metal (UTM) level of the BEOL metal levels. Stacked conformal layers of a metal, an insulator and another metal can line the trenches and cover the top surface of the dielectric material between the trenches. The bottom and top electrode contacts can have various different configurations. For example, in one configuration the top electrode contact is a dual-damascene structure within an upper portion of the UTM level above the MIMCAP; in another configuration both the top and bottom electrode contacts are such dual-damascene structures; etc. Also disclosed are embodiments of a method for forming an IC structure with a UTM level MIMCAP and this method can be integrated into current BEOL processing, including UTM-level dual-damascene processing, to minimize costs.

More particularly, disclosed herein are embodiments of an integrated circuit (IC) structure. The IC structure can include a substrate and back-end-of-the-line (BEOL) metal levels above the substrate. The BEOL metal levels can include a metal-in-metal capacitor (MIMCAP) in a lower portion of an ultra-thick metal (UTM) level. Specifically, the BEOL metal levels can include a UTM level. The UTM level can include multiple dielectric layers. These dielectric layers can include, but are not limited to, a first dielectric layer and a second dielectric layer on the first dielectric layer. The MIMCAP can include a plurality of trenches that extend essentially vertically through the second and first dielectric layers such that they have a relatively high aspect ratio. The MIMCAP can also include a conformal metal-insulator-metal stack on the top of the second dielectric layer and lining the trenches. That is, the MIMCAP can include a first conformal metal layer (i.e., a bottom electrode) on the second dielectric layer and lining the trenches, a conformal insulator layer on the first conformal metal layer, and a second conformal metal layer (i.e., a top electrode) on the conformal insulator layer. A third dielectric layer can be on the second conformal metal layer and can fill the remaining space within the trenches.

In the different embodiments of this IC structure, the bottom and top electrode contacts can have different configurations. Specifically, the top electrode contact can be within an upper portion of the UTM level above the MIMCAP and can be either a thick wire or dual-damascene top electrode contact, which is in contact with a top surface of the second conformal metal layer. The bottom electrode contact can be a wire bottom electrode contact in a metal level immediately below the MIMCAP and in contact with a bottom surface of the first conformal metal layer at the bottoms of the trenches. Alternatively, the bottom electrode contact can be either a thick wire or dual-damascene bottom electrode contact, which is in contact with a top surface of the first conformal metal layer at one end.

Optionally, the IC can include at least one additional dual-damascene interconnect structure can be within the same UTM level as the MIMCAP. The additional dual-damascene interconnect structure can include an additional wire and at at least one additional via interconnect that extends essentially vertically from the additional wire through the second dielectric layer and the first dielectric layer to a metal element below. Thus, the additional wire is positioned laterally adjacent to the electrode contact(s) in the upper portion of the UTM level and the additional via interconnect is positioned laterally adjacent to the MIMCAP in the lower portion of the UTM level.

Also disclosed herein are method embodiments for forming integrated circuit (IC) structures with such a metal-insulator-metal capacitor (MIMCAP).

The method can begin with a substrate. Back-end-of-the-line (BEOL) metal levels, including an ultra-thick metal (UTM) level, can be formed above the substrate. A metal-in-metal capacitor (MIMCAP) can be formed within a lower portion of the UTM level. Specifically, formation of the UTM level can include depositing a first dielectric layer and depositing a second dielectric layer on the first dielectric layer. The MIMCAP can be formed, after deposition of the second dielectric layer, by forming trenches that extend essentially vertically through at least the second dielectric layer and the first dielectric layer and by depositing a conformal metal-insulator-metal (MIM) stack. That is, a first conformal metal layer (i.e., a bottom electrode) can be deposited so as to line the trenches and cover the top surface of the second dielectric layer. A conformal insulator layer can be deposited on the first conformal metal layer and a second conformal metal layer (i.e., a top electrode) can be deposited on the conformal insulator layer. After the second conformal metal layer is deposited, a third dielectric layer can be deposited on the second conformal metal layer so as to fill any remaining spaces within the trenches. A patterning process can subsequently be performed to define the outer edges of the MIMCAP.

The method can also include forming a bottom electrode contact and forming a top electrode contact. The embodiments can vary with regard to how these electrode contacts are formed. For example, the bottom electrode contact can be formed as a wire bottom electrode contact prior to MIMCAP formation and the MIMCAP can be formed such that the trenches extend to the wire bottom electrode contact and further such that the bottom surface of the first conformal metal layer is above and in contact with the wire bottom electrode contact at the bottoms of the trenches. Alternatively, the bottom electrode contact can be formed as either a dual-damascene bottom electrode contact or a thick wire bottom electrode contact in an upper portion of the UTM level above and in contact with the top surface of the first conformal metal layer at one end and, particularly, at an end that extends laterally beyond the other layers of the MIM stack. In either case, the top electrode contact can be formed as either a dual-damascene top electrode contact or a thick wire top electrode contact in the upper portion of the UTM level above and in contact with the top surface of the second conformal metal layer.

One exemplary embodiment of the method can include providing a substrate. Back-end-of-the-line (BEOL) metal levels, including an ultra-thick metal (UTM) level, can be formed above the substrate. A metal-in-metal capacitor (MIMCAP) can be formed within a lower portion of the UTM level. Specifically, formation of the UTM level can include depositing a first dielectric layer and depositing a second dielectric layer on the first dielectric layer. The MIMCAP can be formed, after deposition of the second dielectric layer, by forming trenches that extend essentially vertically through at least the second dielectric layer and the first dielectric layer and by depositing a conformal metal-insulator-metal (MIM) stack. That is, a first conformal metal layer (i.e., a bottom electrode) can be deposited so as to line the trenches and cover the top surface of the second dielectric layer. A conformal insulator layer can be deposited on the first conformal metal layer and a second conformal metal layer (i.e., a top electrode) can be deposited on the conformal insulator layer. After the second conformal metal layer is deposited, a third dielectric layer can be deposited on the second conformal metal layer so as to fill any remaining spaces within the trenches.

A multi-step patterning process can subsequently be performed to define the outer edges of the MIMCAP and to further ensure that an end of the first conformal metal layer extends laterally beyond the other layers in the MIMCAP (i.e., beyond the conformal insulator layer and the second conformal metal layer) and the third dielectric layer. Additional dielectric layers for the UTM level can be formed immediately above the MIMCAP and dual-damascene top and bottom electrodes can be formed in these additional dielectric layers. Specifically, a dual-damascene top electrode contact can be formed such that it is in contact with the top surface of the second conformal metal layer. Additionally, a dual-damascene bottom electrode contact can be formed such that it is in contact with the top surface of the first conformal metal layer at one end (i.e., the end that extends beyond the other layers of the MIMCAP).

Optionally, the method can include, during formation of the MIMCAP and electrode contact(s) thereon, also forming an additional dual-damascene interconnect structure with the same UTM level. The additional dual-damascene interconnect structure can be formed so as to include an additional wire and at least one additional via interconnect that extends essentially vertically from the additional wire through the second dielectric layer and the first dielectric layer to a metal element below. Thus, the additional wire will be positioned laterally adjacent to the electrode contact (s) in the upper portion of the UTM level and the additional via interconnect will be positioned laterally adjacent to the MIMCAP in the lower portion of the UTM level.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

More specifically, smart or connected computing devices (referred to in the art as the internet of things (IoT) devices) are becoming more and more popular in the marketplace. Furthermore, there is an ever-increasing demand for IoT devices to be smaller in size and to have a longer lasting battery life. Power management of such devices, thus, requires capacitors with high capacitance densities. Those skilled in the art will recognize that capacitance density refers to capacitance per chip surface area consumed by the capacitor(s) (e.g., in units of femtofarads (fF)/micrometer squared ($\mu m^2$)). Unfortunately, high capacitance density (e.g., approaching approximately 100 fF/$\mu m^2$ or higher) cannot be achieved with conventional planar dual-electrode or triple-electrode metal-insulator-metal capacitors (MIM-CAPs). Furthermore, while some three-dimensional (3D) MIMCAP structures have been developed to provide increased capacitance density, techniques for manufacturing these 3D MIMCAPS are not readily integrated into current process flows and may be deemed cost-prohibitive.

In view of the foregoing, disclosed herein are embodiments of an integrated circuit (IC) structure, which includes a three-dimensional (3D) metal-insulator-metal capacitor (MIMCAP) that is incorporated into the back-end-of-the-line (BEOL) metal levels to provide increased capacitance density. The MIMCAP can include a plurality of high aspect ratio trenches that extend essentially vertically through dielectric layer(s) within a lower portion of an ultra-thick metal (UTM) level of the BEOL metal levels. Stacked conformal layers of a metal, an insulator and another metal can line the trenches and cover the top surface of the dielectric material between the trenches. The bottom and top electrode contacts can have various different configurations. For example, in one configuration the top electrode contact is a dual-damascene structure within an upper portion of the UTM level above the MIMCAP; in another configuration both the top and bottom electrode contacts are such dual-damascene structures; etc. Also disclosed are embodiments of a method for forming an IC structure with a UTM level MIMCAP and this method can be integrated into current BEOL processing, including UTM-level dual-damascene processing, to minimize costs.

Figure 1A:
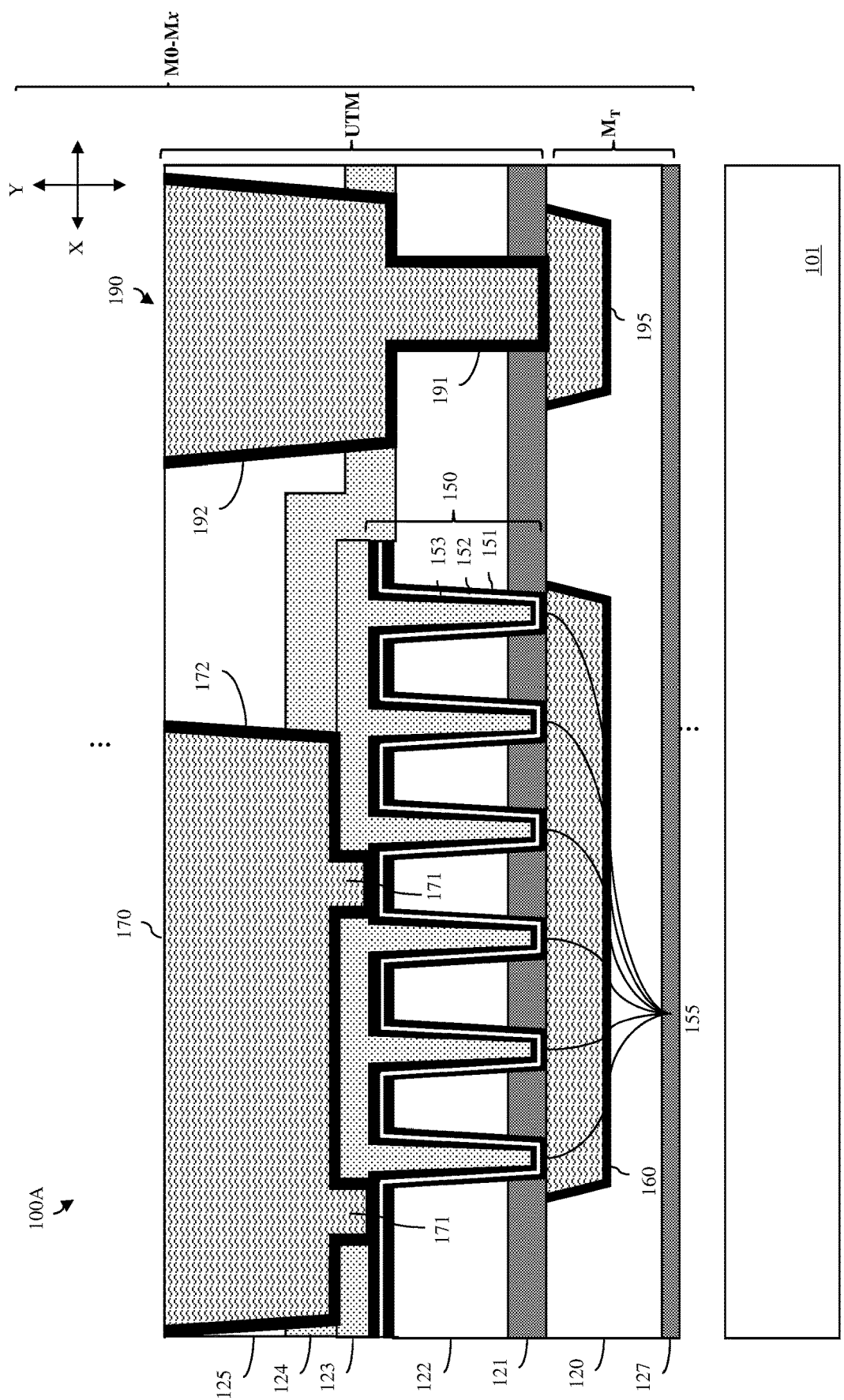
FIGS. 1A-IC are cross-section diagrams of alternative configurations of an embodiment of an integrated circuit (IC) structure that incorporates an ultra-thick metal (UTM) level three-dimensional (3D) metal-insulator-metal capacitor (MIMCAP), a below-MIMCAP bottom electrode contact and an above-MIMCAP top electrode contact.

More particularly, referring to FIGS. 1A-IC and 2A-2C disclosed herein are various embodiments 100A-100C and 200A-200C of an integrated circuit (IC) structure.

The IC structure can include a substrate 101, 201. The substrate 101, 201 can include, for example, a bulk semiconductor structure or a semiconductor-on-insulator structure with front-end-of the line (FEOL) features (e.g., active semiconductor devices, passive semiconductor devices, etc.) and middle-of-the-line (MOL) features (e.g., contact, etc.). The IC structure can further include back-end-of-the-line (BEOL) metal levels (M0-Mx) above the substrate 101, 201. The BEOL metal levels can include various metal features (e.g., wires and via interconnects including single or dual-damascene structures, metal pads, passive devices, etc.) contained with dielectric layers. For purposes of this disclosure, a "dual-damascene" structure refers to a structure formed using a dual-damascene technique where patterning and etch processes are used to create wire trench(es) and one or more via holes below each wire trench. Then, a single metal deposition process is used to simultaneously fill the wire trench(es) and via hole(s), thereby forming contiguous metal structure (referred to herein as a dual-damascene structure). As discussed in greater detail below, the present invention is directed toward a BEOL three-dimensional (3D) metal-insulator-metal capacitor (MIMCAP) 150, 250 structure and the top and bottom electrode contacts for that MIMCAP 150, 250. Therefore, the FEOL features, MOL features and other BEOL features have been omitted from the description and drawings in order to allow the reader to focus on the salient aspects of the disclosed IC structure embodiments.

The BEOL metal levels can include both standard metal levels (referred to here as non-ultra-thick metal (non-UTM) levels) and, above the standard metal levels, at least one ultra-thick metal (UTM) level. The non-UTM levels may have stepped increases in thicknesses from the M0 level to the top (i.e., uppermost) standard metal level ($M_T$). For example, at the 22 nm technology node, the non-UTM levels may have thicknesses ranging from about 0.07 μm to about 1.5 μm with stepped increases from the M0 level at 0.07 μm thick to the $M_T$ level at 1.5 μm. The UTM level(s) may have thicknesses of 1 μm or more and, typically, may have thicknesses of 3 μm or more (e.g., a thickness of approximately 4 μm). Those skilled in the art will recognize that the number of metals levels (including non-UTM and UTM levels) and the thicknesses of those metal levels may vary depending on the technology node.

The IC structure can further include a metal-in-metal capacitor (MIMCAP) 150, 250 in a UTM level within the BEOL metal levels (M0-Mx). As illustrated, this UTM level can be, for example, a first UTM level above the top standard metal level ($M_T$).

The lower portion of this UTM level can include multiple dielectric layers. These dielectric layers can include, but are not limited to, a first dielectric layer 121, 221 and a second dielectric layer 122, 222 on the first dielectric layer. The first dielectric layer 121, 221 can be, for example, a barrier low-K dielectric layer (e.g., a dielectric layer of amorphous, hydrogenated, silicon carbide or a BloK™ layer) or a dielectric layer of any other suitable low-K or ultra-low-K dielectric material. For purposes of this disclosure, a low-K dielectric material refers to a dielectric material with a dielectric constant that is less than 3.9 and an ultra-low K material refers to a dielectric material with a dielectric constant of less than 2.5. The second dielectric layer 122, 222 can be, for example, a silicon dioxide layer. This silicon dioxide layer can be a TEOS silicon dioxide layer. Those skilled in the art will recognize that a TEOS silicon dioxide layer is a silicon dioxide layer deposited by plasma-enhanced chemical vapor deposition (PECVD) using tetraethyl orthosiliciate (TEOS) as the silicon source. In any case, the second dielectric layer 122, 222 can be relatively thick as compared to the first dielectric layer 121, 221. For example, the first dielectric layer 121, 221 can have a thickness ranging from approximately 50 to 100 nm and the second dielectric layer 122, 222 can have a thickness ranging from approximately 500 to 1000 nm.

The lower portion of the UTM level can further include the MIMCAP 150, 250. The MIMCAP 150, 250 can include a plurality of trenches 155, 255 that extend essentially vertically through the second dielectric layer 122, 222 and further through the first dielectric layer 121, 221. Thus, the depth of each of these trenches 155, 255 (as measured in the Y-direction) will be at least be equal to the combined thicknesses of the first dielectric layer 121, 221 and the second dielectric layer 122, 222 (i.e., ranging from approximately 550 to 1100 nm). The width of each of these these trenches 155, 255 (as measured in the X-direction) can range, for example, from approximately 100 to 400 nm. Thus, the each of the trenches 155, 255 has a relatively high aspect ratio.

Depths of the trenches vary in the exemplary embodiments shown in the Figures. For example, in the embodiments 100A of FIG. 1A, 100C of FIG. 1C, 200A of FIG. 2A and 200C of FIG. 2C, the trenches 155, 255 can be contained within the UTM level. That is, they can extend through the second dielectric layer 122, 222 and the first dielectric layer 121, 221 so that the bottoms of these trenches 155, 255 are approximately level with the bottom surface of the first dielectric layer 121, 221 (i.e., at the interface between the first dielectric layer 121, 221 of the UTM level and the metal level immediately below). Thus, the depth of the trenches 155, 255 in these embodiments is essentially equal to the combined thicknesses of the first and second dielectric layers. However, in the embodiments 100B of FIG. 1B and 200B of FIG. 2B, the trenches 155, 25 can extend deeper into a metal level below. Specifically, the UTM level can be on the top standard metal level ($M_T$), which includes another TEOS silicon dioxide layer 120, 220 on another low-K dielectric layer 127, 227; $M_T$ can be on a lower standard metal level ($M_{T-1}$), which includes yet another TEOS silicon dioxide layer and another low-K dielectric layer; and so on. Thus, for a higher aspect ratio, the trenches 155, 255 can be etched down through dielectric layers 120, 220 and 127, 227 of $M_T$, as illustrated, and optionally even deeper (i.e., into the dielectric layers of $M_{T-1}$).

It should be noted that the length of each of these trenches 155, 255 (in the Z-direction not shown) can range, for example, from approximately 10 µm to 200 µm.

The MIMCAP 150, 250 can also include a conformal metal-insulator-metal (MIM) stack on the top of the second dielectric layer 122, 222 and lining the trenches 155, 255. Specifically, the MIMCAP 150, 250 can include: a first conformal metal layer 151, 251 on the second dielectric layer 122, 222 and lining the trenches 155, 255; a conformal insulator layer 152, 252 on the first conformal metal layer 151, 251; and a second conformal metal layer 153, 253 on the conformal insulator layer 152, 252. The first conformal metal layer 151, 251 can be a metal or metal alloy such as titanium nitride, tantalum nitride, tungsten or any other suitable metal or metal alloy that can, during processing, be deposited so as to line the high aspect ratio trenches 155, 255. The conformal insulator layer 152, 252 can include one or more layers of high-K dielectric material(s). For purposes of this disclosure, a high-K dielectric material refers to a dielectric material with a dielectric constant that is greater 7. Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.) that can, during processing, be deposited on the first conformal metal layer 151, 251 so as to also line the high aspect ratio trenches 155, 255. The second conformal metal layer 153, 253 can be made of a metal or metal alloy (e.g., titanium nitride, tantalum nitride, tungsten or any other suitable metal or metal alloy) that can, during processing, be deposited onto the conformal insulator layer so as to also line the high aspect ratio trenches 155, 255. It should be noted that the metal or metal alloy materials of the first and second conformal metal layers may be the same or different.

In exemplary structures, where the width of each trench 155, 255 is 200-300 nm and the depth of each trench is 600 nm (e.g., given a 50 nm first dielectric layer and a 550 nm second dielectric layer), the thickness of the first conformal metal layer 151, 251 can be 30-50 nm, the thickness of the conformal insulator layer 152, 252 can be 5-8 nm and the thickness of the second conformal metal layer 153, 253 can be 30-50 nm.

The UTM level can further include a third dielectric layer 123, 223 and, particularly, a conformal third dielectric layer on the second conformal metal layer 153, 253 and filling any remaining space within the trenches 155, 255. The third dielectric layer can be, for example, a silicon nitride layer with a thickness of 30-70 nm (e.g., approximately 50 nm). The third dielectric layer 123, 223 and the portions of the MIM stack on the top surface of the second dielectric layer 122, 222 below can be patterned and etched during processing to define the outer edges and, thereby, the surface area of the MIMCAP 150, 250.

The IC structure can further include at least one bottom electrode contact 160, 260 in contact with the first conformal metal layer 151, 251 (i.e., the bottom electrode) of the MIMCAP 150, 250 and at least one top electrode contact 170, 270 in contact with the second conformal metal layer 153, 253 (i.e., the top electrode) of the MIMCAP 150, 250. In the different embodiments of this IC structure, the bottom and top electrode contacts of the MIMCAP can have different configurations. For example, the top electrode contact 170, 270 can be within an upper portion of the UTM level above the MIMCAP and can be either a dual-damascene top electrode contact (see the embodiments 100A-100B and 200A-200B) or a wire top electrode contact (see the embodiments 100C or 200C), which is in contact with a top surface of the second conformal metal layer. The bottom electrode contact 160, 260 can be a wire bottom electrode contact in a metal level immediately below the MIMCAP and in contact with a bottom surface of the first conformal metal layer at the bottoms of the trenches (see the embodiments 100A-100C). Alternatively, the bottom electrode contact 160, 260 can be within the upper portion of the UTM level and, like the top electrode contact, can be either a dual-damascene bottom electrode contact (see the embodiments 200A-200B) or a wire bottom electrode contact (see the embodiment 200C), which is in contact with a top surface of the first conformal metal layer 251 at one end 256. It should be noted that in these embodiments 200A-200C where the bottom electrode contact 260 is contained within the upper portion of the UTM level, one end 256 of the first conformal metal layer 251 can extend laterally beyond the other layers of the MIM stack (i.e., beyond the conformal insulator layer 252 and the second conformal metal layer 253) and further beyond the third dielectric layer 223 so as to provide a landing spot for the bottom electrode contact.

More specifically, the upper portion of the UTM level can further include a fourth dielectric layer 124, 224 and, particularly, a conformal fourth dielectric layer that covers the top surface of the third dielectric layer 123, 223 and further extending laterally beyond the outer edges of the MIMCAP 150, 250 and down onto the top surface of the second dielectric layer 122, 222. It should be noted that in the embodiments 200A-200C where the bottom electrode contact is contained with the upper portion of the UTM, the fourth dielectric layer 224 will also cover the end 256 of the first conformal metal layer 251 that extends laterally beyond the other layers of the MIMCAP 250. In any case, the fourth dielectric layer 124, 224 can be made of the same dielectric material as the third dielectric layer 123, 223. For example, the fourth dielectric layer can be another silicon nitride layer. Furthermore, the fourth dielectric layer 124, 224 can be thicker than the third dielectric layer 123, 223. For example, the fourth dielectric layer 124, 224 can have a thickness of 100-200 nm (e.g., approximately 120 nm).

The upper portion of the UTM level can also include a fifth dielectric layer 125, 225 and, particularly, a blanket fifth dielectric layer 125, 225 with a planarized top surface. The fifth dielectric layer 125, 225 can be the uppermost dielectric layer in the UTM level and can be another silicon dioxide layer and, particularly, another TEOS silicon dioxide layer. This fifth dielectric layer 125, 225 can be relatively thick. For example, the minimum thickness of the fifth dielectric layer 125, 225 in the region of the IC structure above the MIMCAP 150, 250 can be, for example, greater than 2500 nm such that the overall thickness of the UTM level is at least 3 µm (e.g., approximately 4 µm) from the bottom surface of the first dielectric layer 121, 221 to the top surface of the fifth dielectric layer 125, 225.

Referring specifically, to the embodiments 100A-100C of the IC structure shown in FIGS. 1A-1C, the bottom electrode contact 160 can be a wire bottom electrode contact within one of the metal levels below the UTM level and aligned below and in direct contact with the first conformal metal layer 151 of the MIMCAP 150. For example, as illustrated in the embodiments 100A and 100C, a wire trench can be in the top surface of the TEOS silicon dioxide layer 120 of the metal level $M_T$, can optionally be lined with diffusion barrier and/or adhesion layers, and can be filled with a metal or metal alloy conductor, thereby forming a metal wire (i.e., a wire bottom electrode contact). Similarly, as illustrated in the embodiment 100B, a wire trench can be in the TEOS silicon dioxide layer of the metal level $M_{T-1}$, can optionally be lined with diffusion barrier and/or adhesion layers, and can be filled with a metal conductor, thereby forming a metal wire (i.e., the wire bottom electrode contact). In either case, the top surface of the wire bottom electrode contact 160 can be in contact with the bottom surface of the first conformal metal layer 151 of the MIM-CAP 150 at the bottoms of one or more of the trenches 155.

Alternatively, referring to the embodiments 200A-200C of the IC structure shown in FIGS. 2A-2C, the bottom electrode contact 260 can be within an upper portion of the UTM level above and in direct contact with the top surface of one end 256 of the first conformal metal layer 251 (see the detailed discussion below).

In any case, the top electrode contact(s) 170, 270 can be within the upper portion of the UTM level aligned above the MIMCAP 150, 250. This top electrode contact 170, 270 can be a dual-damascene top electrode contact (e.g., as shown in the embodiments 100A-100B of FIGS. 1A-1B and 200A-200B of FIGS. 2A-2B). The dual-damascene top electrode contact can include a wire trench that extends from the top surface of the fifth dielectric layer 125, 225 down into or through the fourth dielectric layer 124, 224 and one or more via holes that extend essentially vertically from the bottom of the wire trench through the third dielectric layer down to the top surface of the second conformal metal layer 153, 253 of the MIMCAP 150, 250. The wire trench and via hole(s) can optionally be lined with diffusion barrier and/or adhesion layers and filled with a metal conductor, thereby forming a metal wire 172, 272 and via interconnect(s) 171, 271 (i.e., the dual-damascene top electrode contact). Alternatively, the top electrode contact 170, 270 can be a wire top electrode contact (e.g., as shown in the embodiments 100C of FIG. 1C and 200C of FIG. 2C). The wire top electrode contact can include a wire trench that extends from the top surface of the fifth dielectric layer 125, 225 down through the fourth dielectric layer 124, 224 and through the third dielectric layer 123, 223 such that the bottom surface of the wire trench exposes the top surface of the second conformal metal layer 153, 253 of the MIMCAP 150, 250. The wire trench can optionally be lined with diffusion barrier and/or adhesion layers and filled with a metal conductor, thereby forming a metal wire 172, 272 (i.e., a wire top electrode contact).

As discussed in detail above and illustrated in FIGS. 1A-1C, the bottom electrode contact 160 is a wire bottom electric contact in a metal level below the UTM level. Alternatively, however, the bottom electrode contact 270, like the top electrode contact, can be with the upper portion of the UTM level. That is, this bottom electrode contact 260 can be a dual-damascene bottom electrode contact (e.g., as shown in the embodiments 200A-200B of FIGS. 2A-2B). The dual-damascene bottom electrode contact can include a wire trench that extends from the top surface of the fifth dielectric layer 225 down to fourth dielectric layer 224 and one or more via holes that extend essentially vertically from the bottom of the wire trench through the fourth dielectric layer 224 down to the top surface of the first conformal metal layer 251 at that end 256 which extends laterally beyond the other layers of the MIM stack. The wire trench and via hole(s) can optionally be lined with diffusion barrier and/or adhesion layers and filled with a metal conductor, thereby forming a metal wire 262 and via interconnect(s) 261 (i.e., the dual-damascene bottom electrode contact). Alternatively, the bottom electrode contact 260 can be a wire bottom electrode contact (e.g., as shown in the embodiment 200C of FIG. 2C). The wire bottom electrode contact can include a wire trench that extends from the top surface of the fifth dielectric layer 225 down through the fourth dielectric layer 224 and exposes the top surface of the first conformal metal layer 251 at that end 256 which extends laterally beyond the other layers of the MIM stack. The wire trench can optionally be lined with diffusion barrier and/or adhesion layers and filled with a metal conductor, thereby forming a metal wire 262 (i.e., a wire bottom electrode contact).

Those skilled in the art will recognize that the embodiments described above and illustrated in the figures with dual-damascene electrode contacts and, particularly, with dual-damascene electrode contacts having a limited number of via interconnects (e.g., 1 or 2) so as to minimize parasitic capacitance over the embodiments with wire electrode contacts.

In addition to the MIMCAP 150, 250 and the other features, described above, the IC structure can also include an additional dual-damascene interconnect structure 190, 290 within the UTM level positioned laterally adjacent to the MIMCAP 150, 250 and any electrode contact(s) thereon. Specifically, the dual-damascene interconnect structure 190, 290 can include an additional wire trench in the upper portion of the UTM level. The additional wire trench can extend from the top surface of the fifth dielectric layer 125, 225 down through fourth dielectric layer 124, 224 to the top surface of the second dielectric layer 122, 222. The dual-damascene interconnect structure 190, 290 can further include at least one additional via hole that extends essentially vertically from the bottom of the additional wire trench through the second dielectric layer 122, 222 and the first dielectric layer 121, 221. The additional wire trench and additional via hole can optionally be lined with diffusion barrier and/or adhesion layers and filled with a metal conductor, thereby forming an additional metal wire 192, 292 and an additional via interconnect 191, 291 (i.e., the dual-damascene structure). Thus, the additional metal wire 192, 292 is positioned laterally adjacent to the electrode contact (s) in the upper portion of the UTM level and the additional via interconnect 191, 291 is positioned laterally adjacent to the MIMCAP 150 in the lower portion of the UTM level.

In this case, the IC structure can further include a metal element 195, 195 in the metal level ($M_T$) below the UTM level (e.g., in and at the top surface of the TEOS silicon dioxide layer 120, 220), aligned directly below the additional dual-damascene interconnect structure 190, 290, and contacted by the additional via interconnect 191, 291. The metal element 195, 295 can be, for example, a metal wire (as illustrated), a metal pad, a via interconnect, or any other BEOL metal element.

The metal conductors used for the above-described top electrode contact 170, 270, bottom electrode contact 160, 260, the additional dual-damascene interconnect structure 195, 295, and the metal element 195, 295 can be the same or different and can be any of the following: copper, aluminum, or any other suitable BEOL metal or metal alloy. The diffusion barrier and/or adhesion layers can be relatively thin conformal layers of, for example, tantalum, tantalum nitride, titanium, titanium nitride, or any other suitable metal interconnect liner material. For example, in an exemplary embodiment, the above-described BEOL metal features (i.e., the electrode contacts, damascene structures, metal elements, etc.) can be made of copper with a tantalum nitride/tantalum liner. In another exemplary embodiment, the BEOL metal features can be made of aluminum with a titanium/titanium nitride liner.

It should be noted that the embodiments 100A-100C, 200A-200C of the IC structure, discussed above and illustrated in FIGS. 1A-IC and 2A-2C are provided for illustration purposes and are not intended to be limiting. Alternative embodiments with different combinations of the above-described features are anticipated. For example, although not illustrated or discussed above, other embodiments could include a combination of trenches 155, 255 that extend into a lower metal level (e.g., into $M_T$, as shown in the embodiments 100B and 200B) and wire electrode contacts in the upper portion of the UTM level (e.g., as shown in embodiments 100C and 200C).

Figure 12:
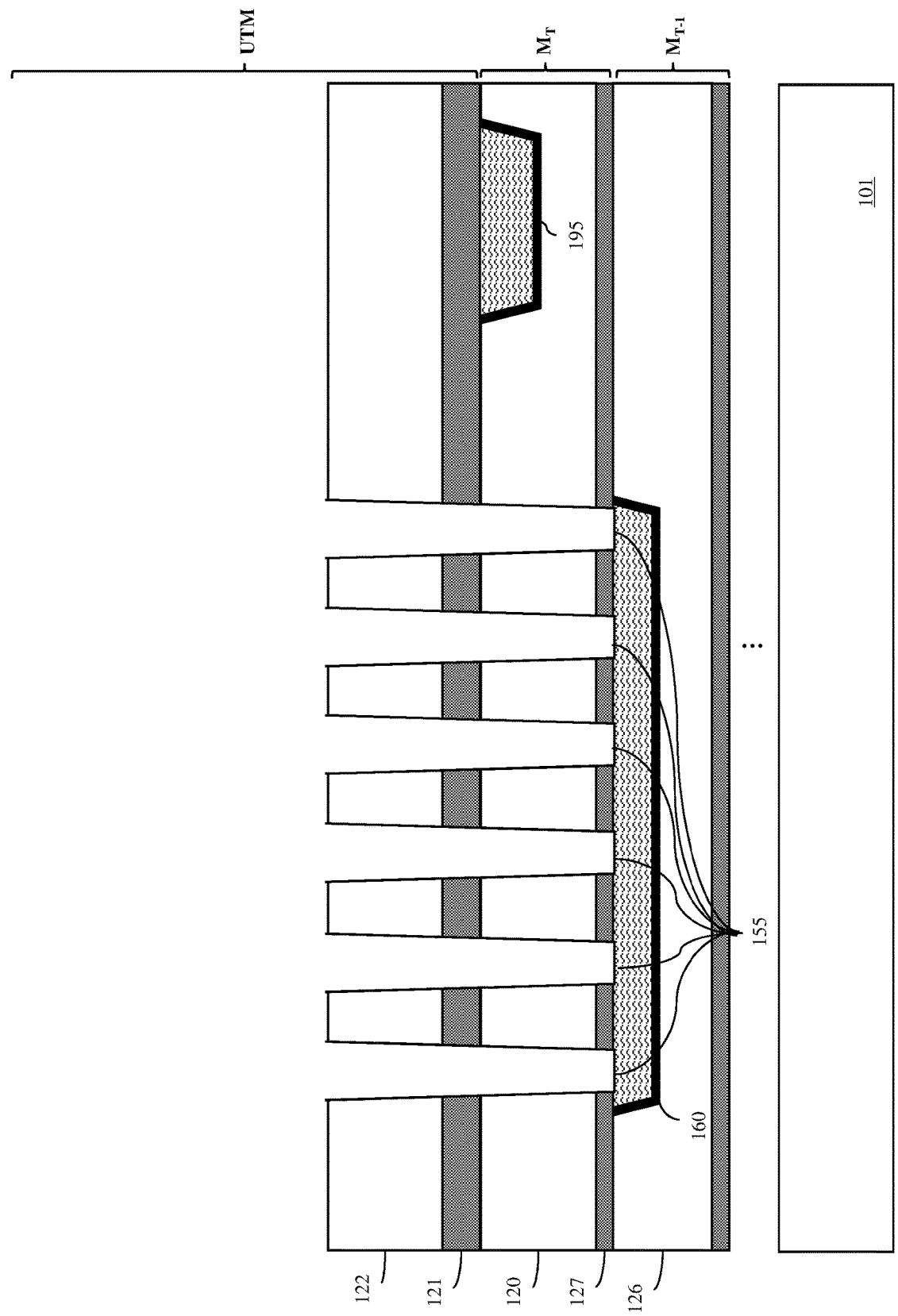
FIG. 12 is a cross-section diagram of a partially completed IC structure showing an alternative process step that can be employed to form the IC structure shown in FIG. 1B.
Figure 13:
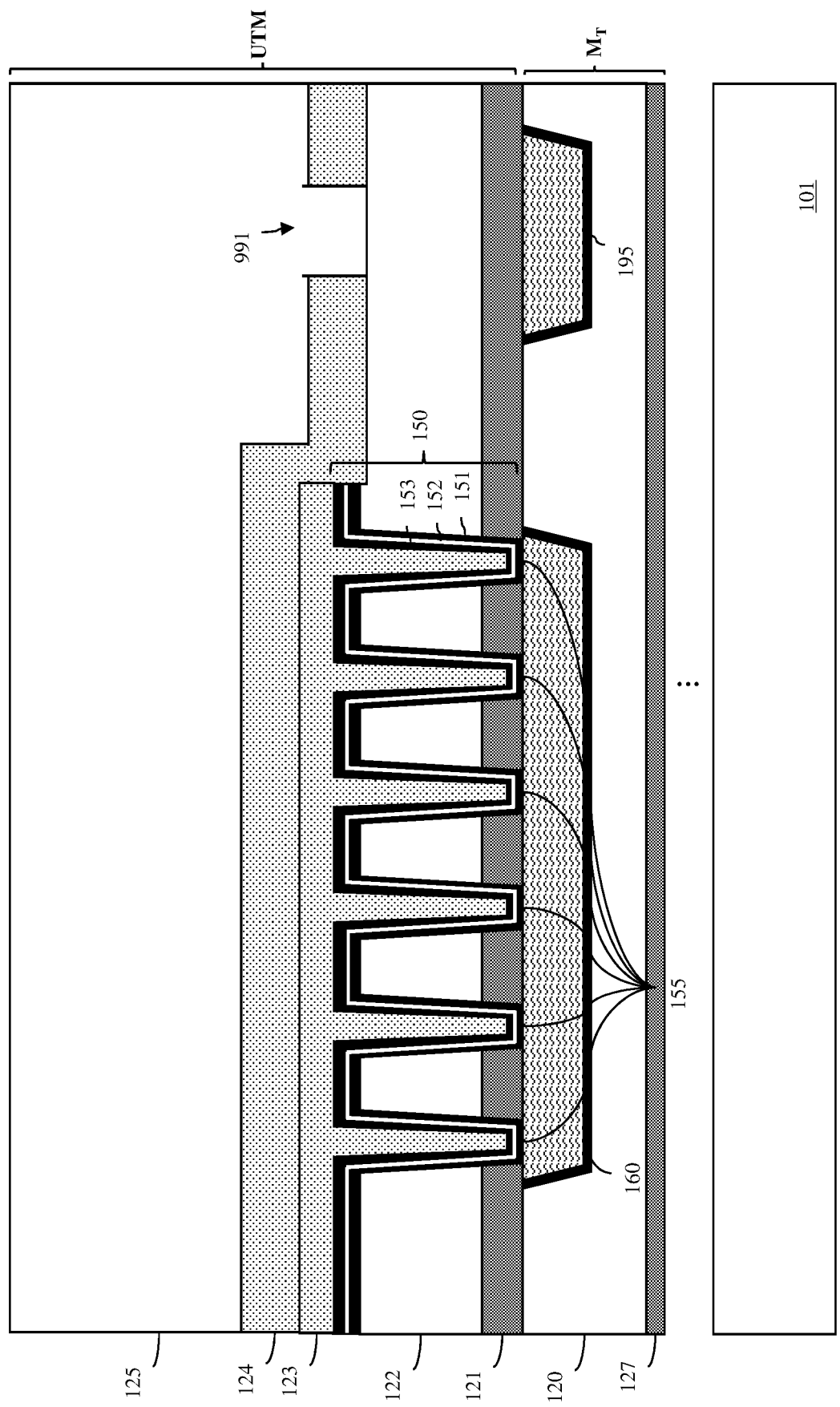
FIGS. 13-14 are cross-section diagrams of partially completed IC structures showing alternative process steps that can be employed to form the IC structure shown in FIG. 1C.
Figure 14:
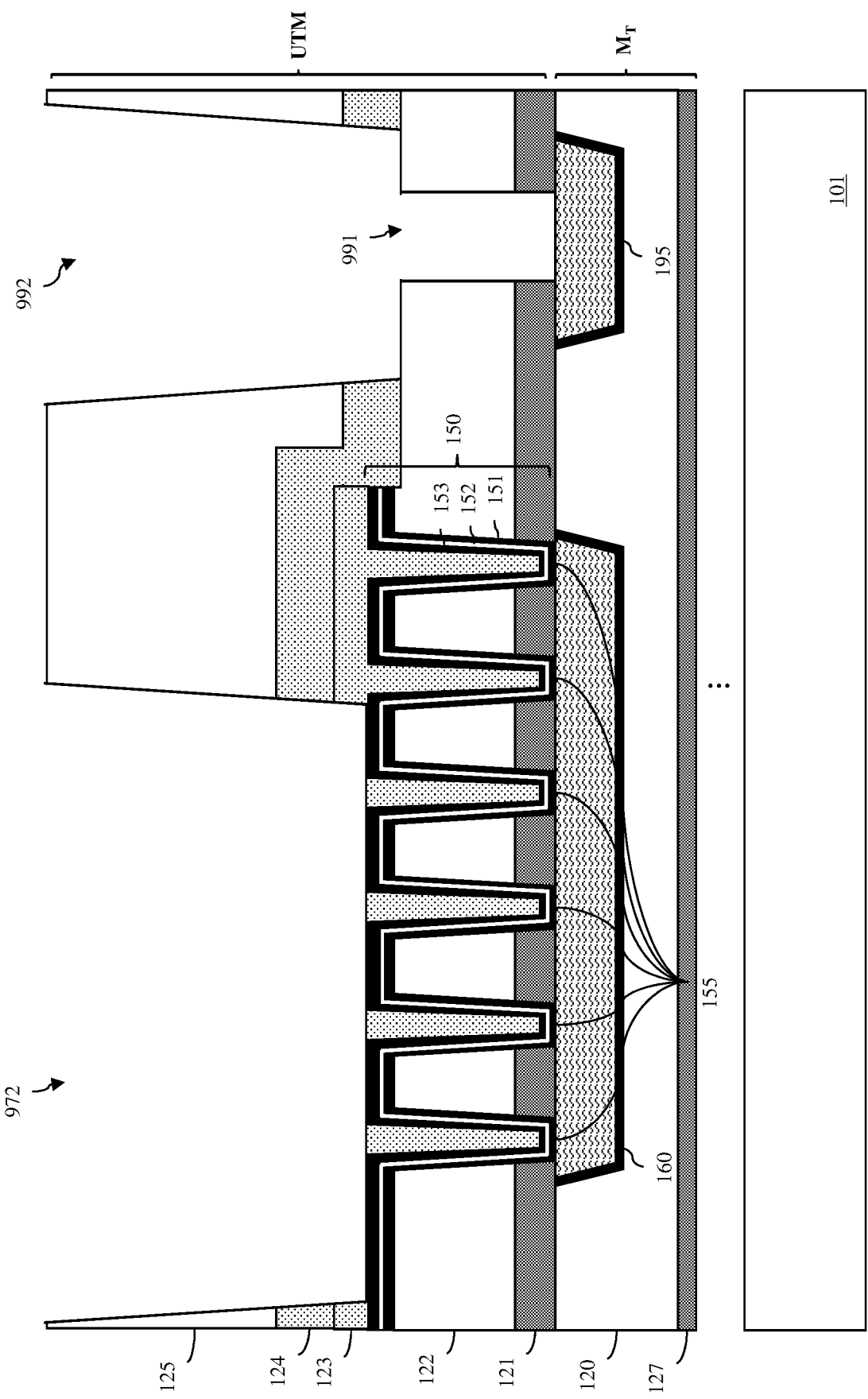
Figure 15:
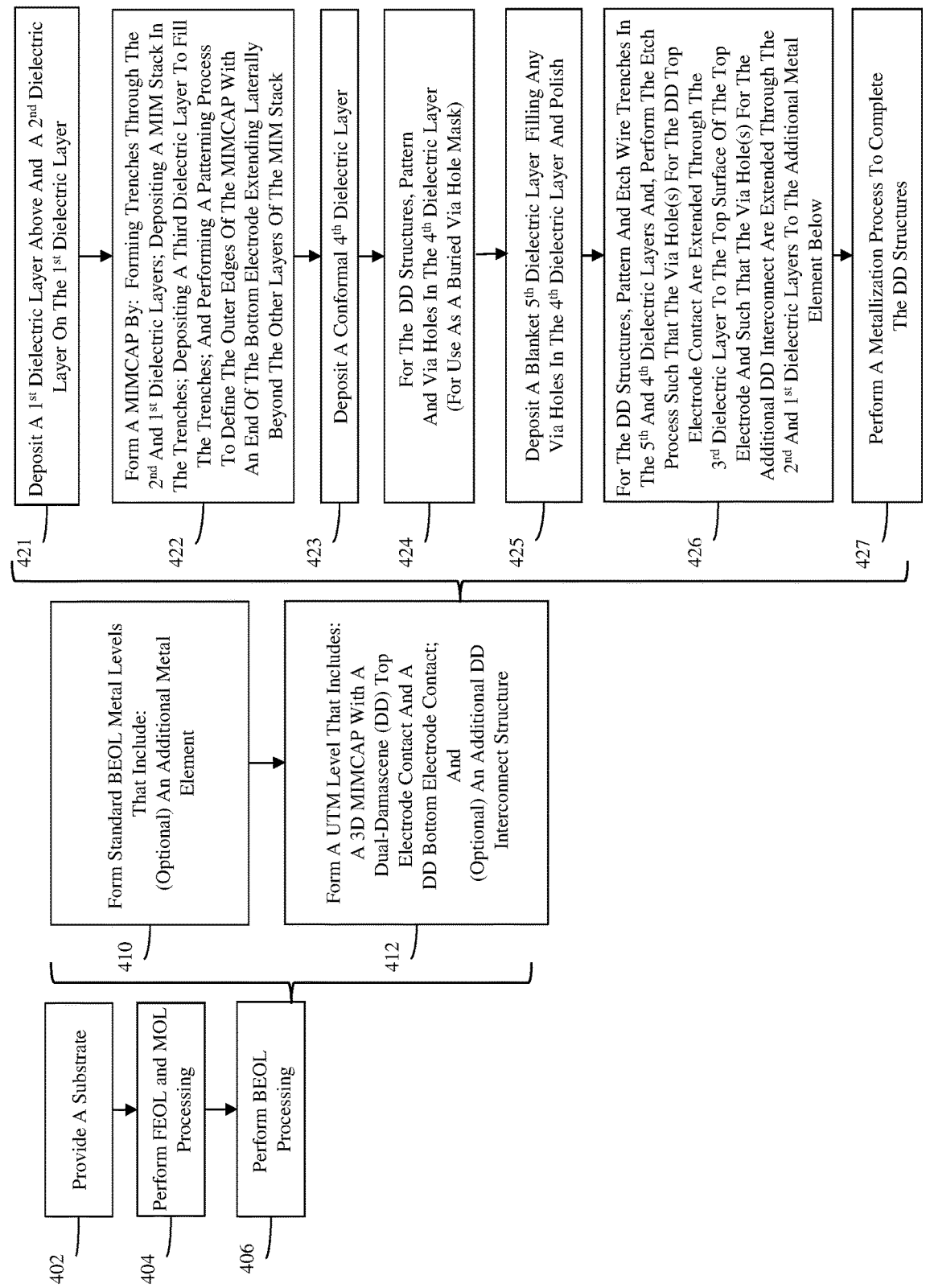
FIG. 15 is a flow diagram illustrating a method of forming the embodiment of the IC structure shown in FIG. 2A.
Figure 24:
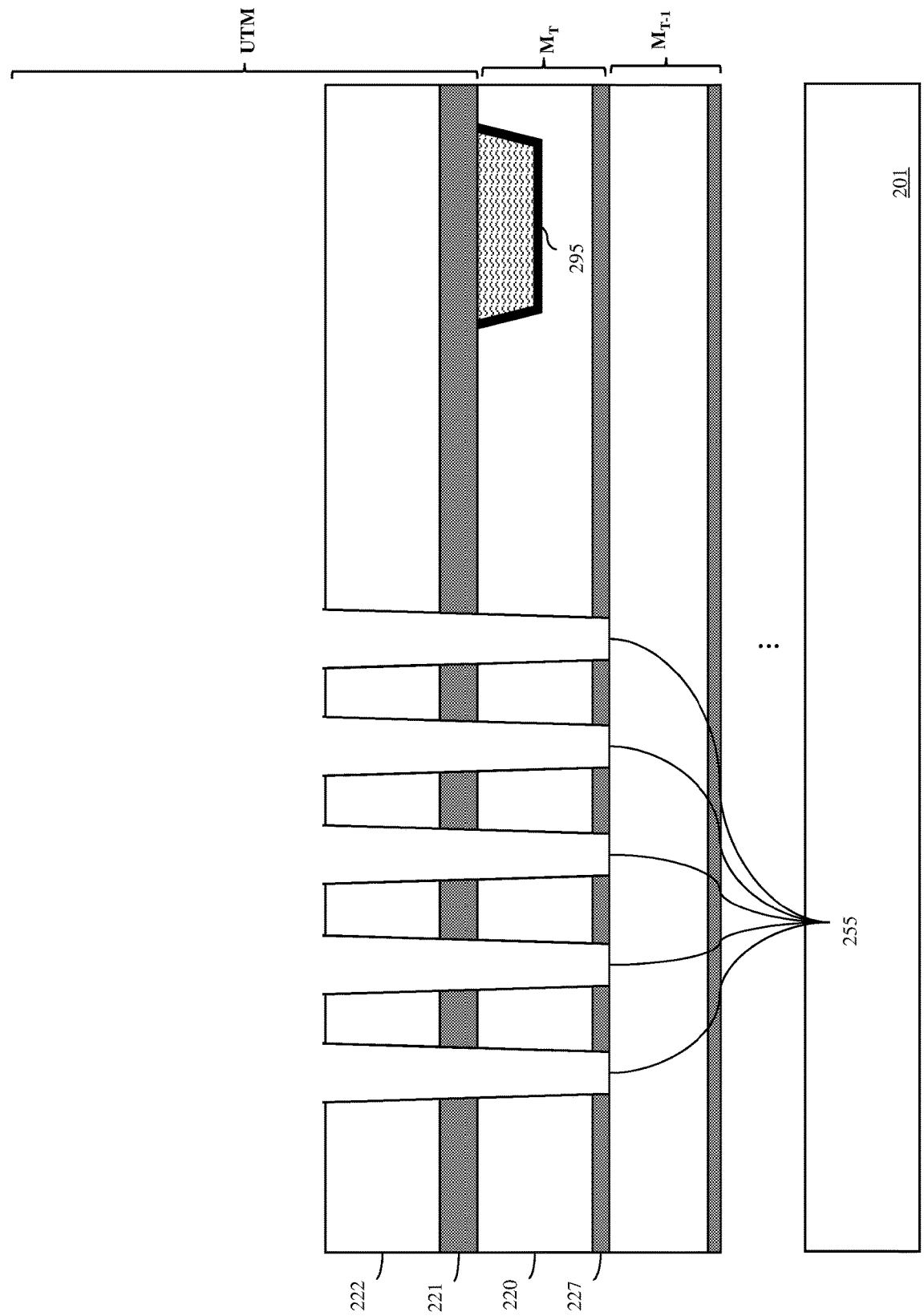
FIG. 24 is a cross-section diagram of a partially completed IC structure showing an alternative process step that can be employed to form the IC structure shown in FIG. 2B.
Figure 25:
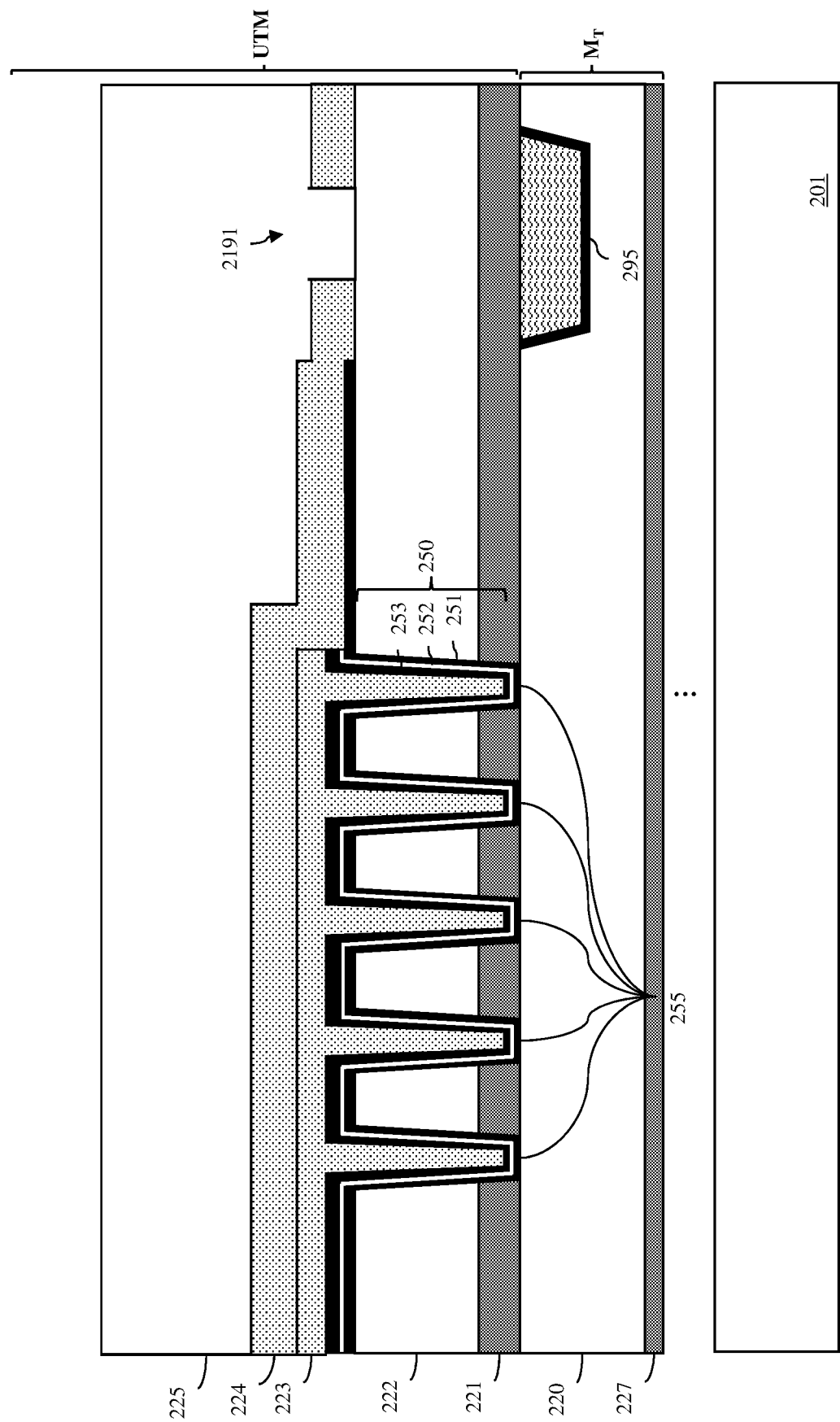
FIGS. 25-26 are cross-section diagrams of partially completed IC structures showing alternative process steps that can be employed to form the IC structure shown in FIG. 2C.
Figure 26:
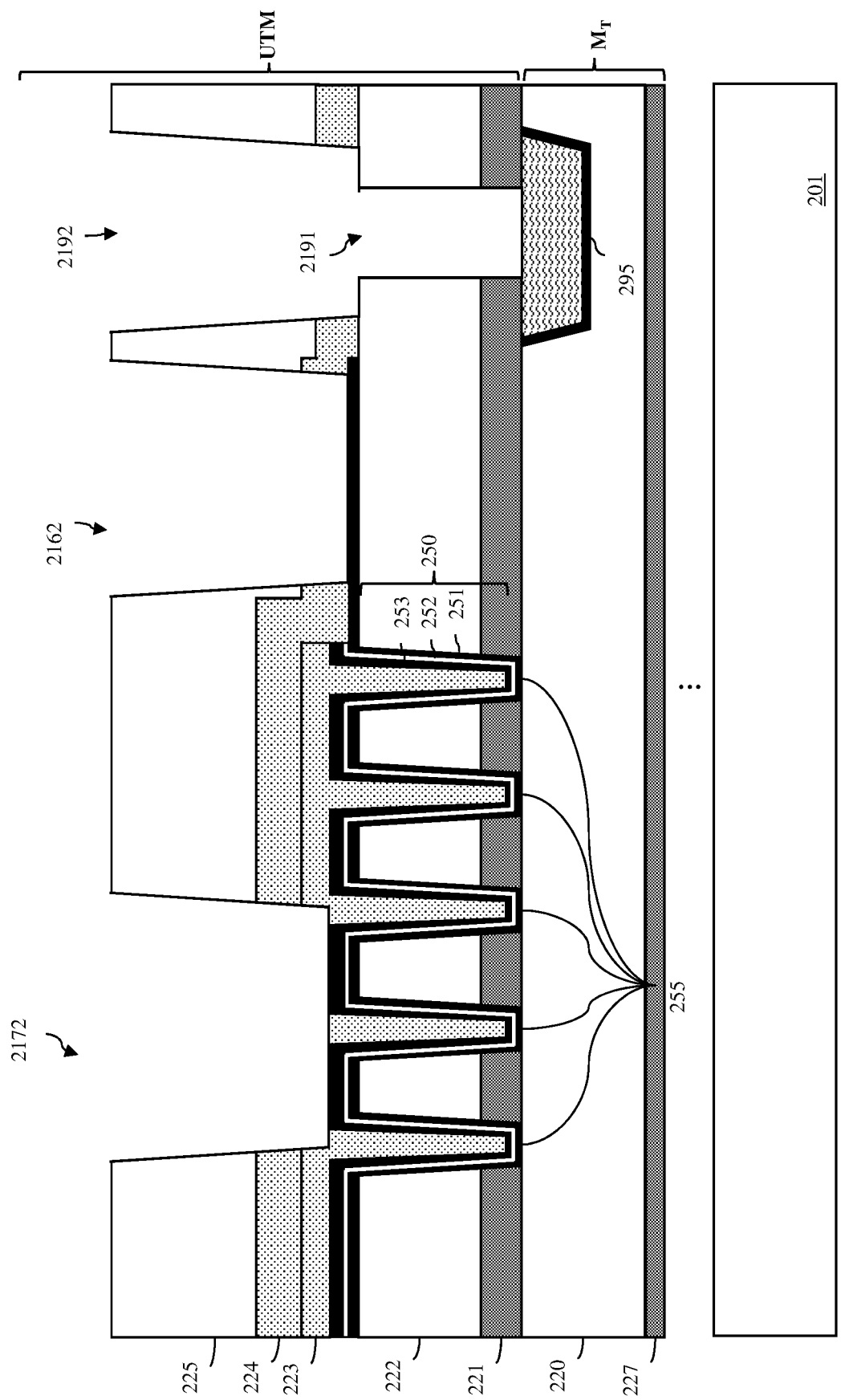

Also disclosed herein are embodiments of a method for forming an integrated circuit (IC) structure, as described above, that includes a three-dimensional (3D) metal-insulator-metal capacitor (MIMCAP) in an ultra-thick metal (UTM) level of the back-end-of-the-line (BEOL) metal levels. The flow diagram of FIG. 3 and the cross-section drawings of FIGS. 4-11 illustrate an embodiment of the method that results in the embodiment 100A of the IC structure shown in FIG. 1A. FIGS. 12-14 illustrate alternative process steps that can be used to form the embodiments 100B and 100C of the IC structure shown in FIGS. 1B and 1C, respectively. FIG. 15 and the cross-section drawings of FIGS. 16-23 illustrate an embodiment of the method that results in the embodiment 200A of the IC structure shown in FIG. 2A. FIGS. 24-26 illustrate alternative process steps that can be used to form the embodiments 200B and 200C of the IC structure shown in FIGS. 2B and 2C, respectively.

Figure 3:
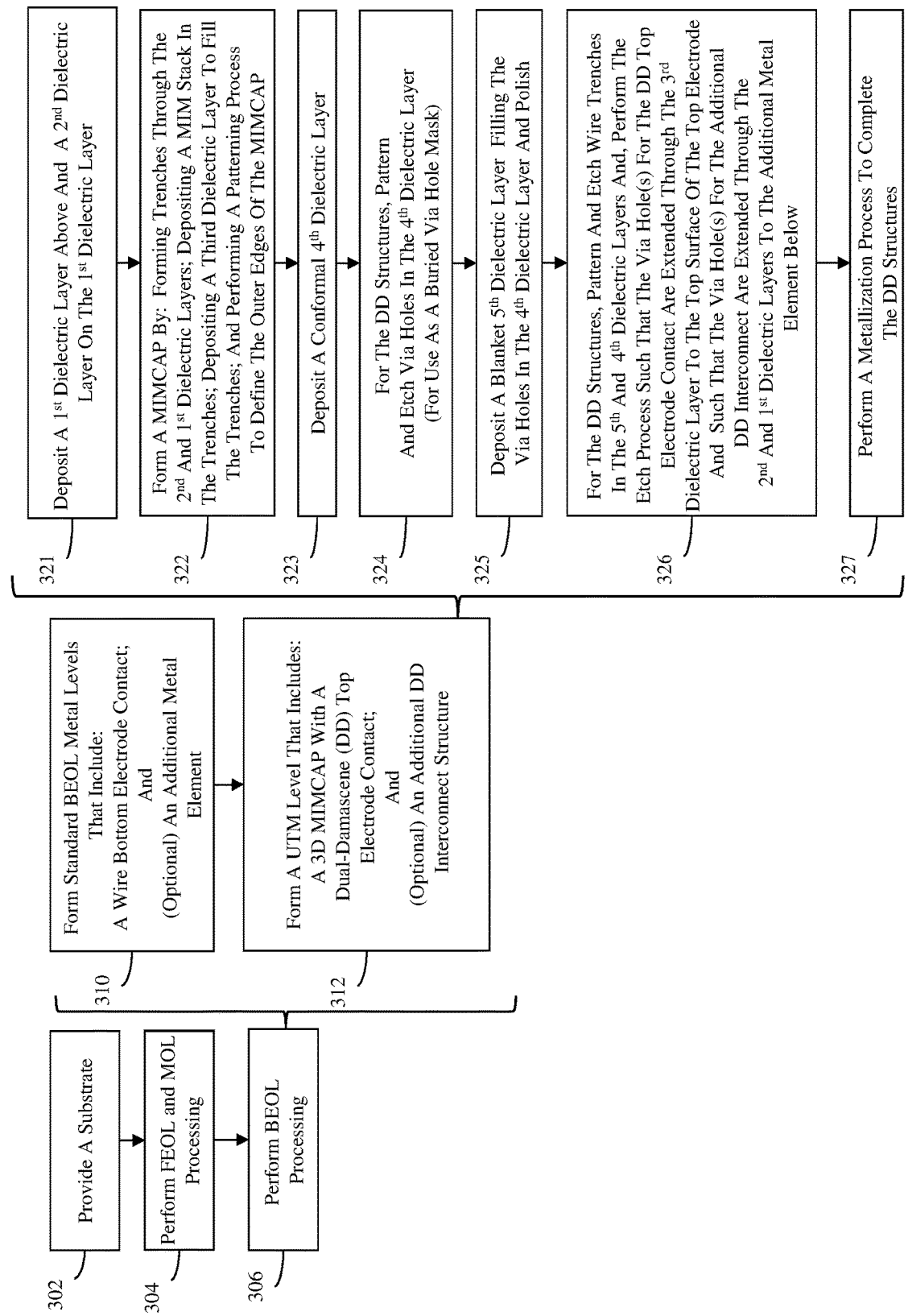
FIG. 3 is a flow diagram illustrating a method of forming the embodiment of the IC structure shown in FIG. 1A.

In any case, the method can begin with a substrate 101, 201 (see process step 302 of FIG. 3 and process step 402 of FIG. 15). The substrate can include, for example, a bulk semiconductor structure or a semiconductor-on-insulator structure. The method can further include performing front-end-of-the line (FEOL) processing (e.g., formation active semiconductor devices, passive semiconductor devices, etc.) and middle-of-the-line (MOL) (e.g., formation of MOL contacts, etc.) of the substrate 101, 201 (see process step 304 of FIG. 3 and process step 404 of FIG. 15). The method can further include, after FEOL and MOL processing, performing back-end-of-the-line (BEOL) processing in order to form BEOL metal levels (M0-Mx) above the substrate 101, 201 (see process step 306 of FIG. 3 and 406 of FIG. 15). The BEOL metal levels can be formed so as to include various metal features (e.g., wires and via interconnects including single or dual-damascene structures, passive devices, etc.) contained within dielectric layers. For purposes of this disclosure, a "dual-damascene" structure refers to a structure formed using a dual-damascene technique where patterning and etch processes are used to create wire trench(es) and one or more via holes below each wire trench. Then, a single metal deposition process is used to simultaneously fill the wire trench(es) and via hole(s), thereby forming contiguous metal structure (referred to herein as a dual-damascene structure). As discussed in greater detail below, the present invention is directed toward formation of a BEOL three-dimensional (3D) metal-insulator-metal capacitor (MIMCAP) structure and the top and bottom electrode contacts for that MIMCAP 150, 250. Therefore, discussion and illustration of the formation of the FEOL features, MOL features and other BEOL features have been omitted in order to allow the reader to focus on the salient aspects of the disclosed IC structure embodiments.

In any case, in each of the method embodiments, the BEOL processing can include formation of standard metal levels (referred to here as non-ultra-thick metal (non-UTM) levels) (see process step 310 of FIG. 3 and process step 410 of FIG. 15) and also formation of at least one ultra-thick metal (UTM) level above the standard metal levels (see process step 312 of FIG. 3 and process step 412 of FIG. 15). The non-UTM levels may be formed so as to have stepped increases in thicknesses from the M0 level to the top (i.e., uppermost) standard metal level ($M_T$). For example, at the 22 nm technology node, the non-UTM levels may be formed so as to have thicknesses ranging from about 0.07 μm to about 1.5 μm with stepped increases from the M0 level at 0.7 μm thick to the $M_T$ level at 1.5 μm. The UTM level(s) may be formed so as to have thicknesses of 1 μm or more and, typically, thicknesses of 3 μm or more (e.g., a thickness of approximately 4 μm). Those skilled in the art will recognize that the number of metals levels (including non-UTM and UTM levels) and the thicknesses of those metal levels may vary depending on the technology node.

Figure 4:
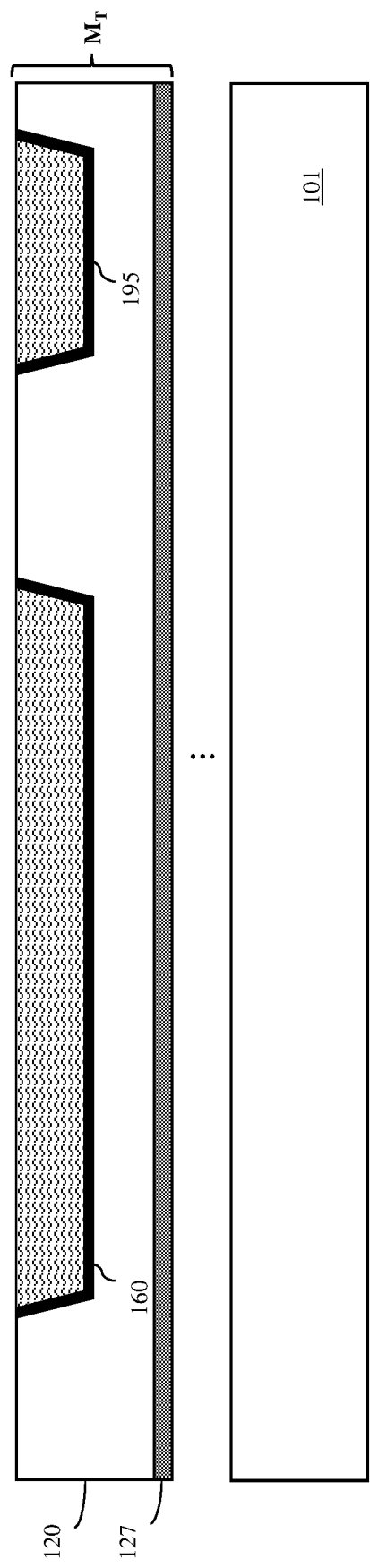
FIGS. 4-11 are cross-section diagrams of partially completed IC structures formed according to the flow diagram of FIG. 3.

Referring specifically to the flow diagram of FIG. 3 and the process steps for forming the embodiment 100A of the IC structure shown in FIG. 1A, process step 310 can include forming standard metal levels including a bottom standard metal level (M0) (not shown), which is the lowermost metal level closest to the substrate 101, up to a top standard metal level ($M_T$), which is the uppermost standard metal level and farthest from the substrate 101 (see FIG. 4). Formation of each of the standard metal levels can include formation of multiple dielectric layers including a thin barrier low-K dielectric layer and a thick silicon dioxide layer (e.g., see the layers 127 and 120 of the top standard metal level ($M_T$) shown in FIG. 4). The thin barrier low-K dielectric layer can be, for example, a dielectric layer of amorphous, hydrogenated, silicon carbide or a BloK™ layer, or a dielectric layer of any other suitable low-K dielectric material or ultra-low K material For purposes of this disclosure, a low-K dielectric material refers to a dielectric material with a dielectric constant that is less than 3.9 and an ultra-low K material refers to a dielectric material with a dielectric constant of less than 2.5. The thick silicon dioxide layer can be a TEOS silicon dioxide layer. Those skilled in the art will recognize that a TEOS silicon dioxide layer is a silicon dioxide layer deposited by plasma-enhanced chemical vapor deposition (PECVD) using tetraethyl orthosiliciate (TEOS) as the silicon source.

Process step 310 can further include forming metal elements, including a wire bottom electrode contact 160 and, optionally, at least one additional metal element 195, with the same or different metal levels of the standard metal levels. For example, wire trenches for a wire bottom electrode contact and an additional wire can be lithographically patterned and anisotropically etch into the top surface of the TEOS silicon dioxide layer 120 of $M_T$. A metallization process can then be performed so as to line the trenches with diffusion barrier and/or adhesion layers and to fill the trenches with a metal or metal alloy conductor. A polishing process (e.g., a chemical mechanical polishing (CMP) process) can then be performed so as to remove any conductive material from above the top surface of the TEOS silicon dioxide layer 120, thereby forming a pair of metal wires including the wire bottom electrode contact 160 and the additional metal element 195.

Process step 312 can include forming an ultra-thick metal (UTM) level above the top standard metal level ($M_T$) such that this UTM level includes a metal-insulator-metal capacitor (MIMCAP) 150 in a lower portion of the UTM level above the bottom electrode contact 160, a dual-damascene top electrode contact 170 in an upper portion of the UTM level above the MIMCAP 150 and, optionally, an additional dual-damascene interconnect structure 190 positioned laterally adjacent to the MIMCAP 150 and top electrode contact 170 thereon.

Figure 5:
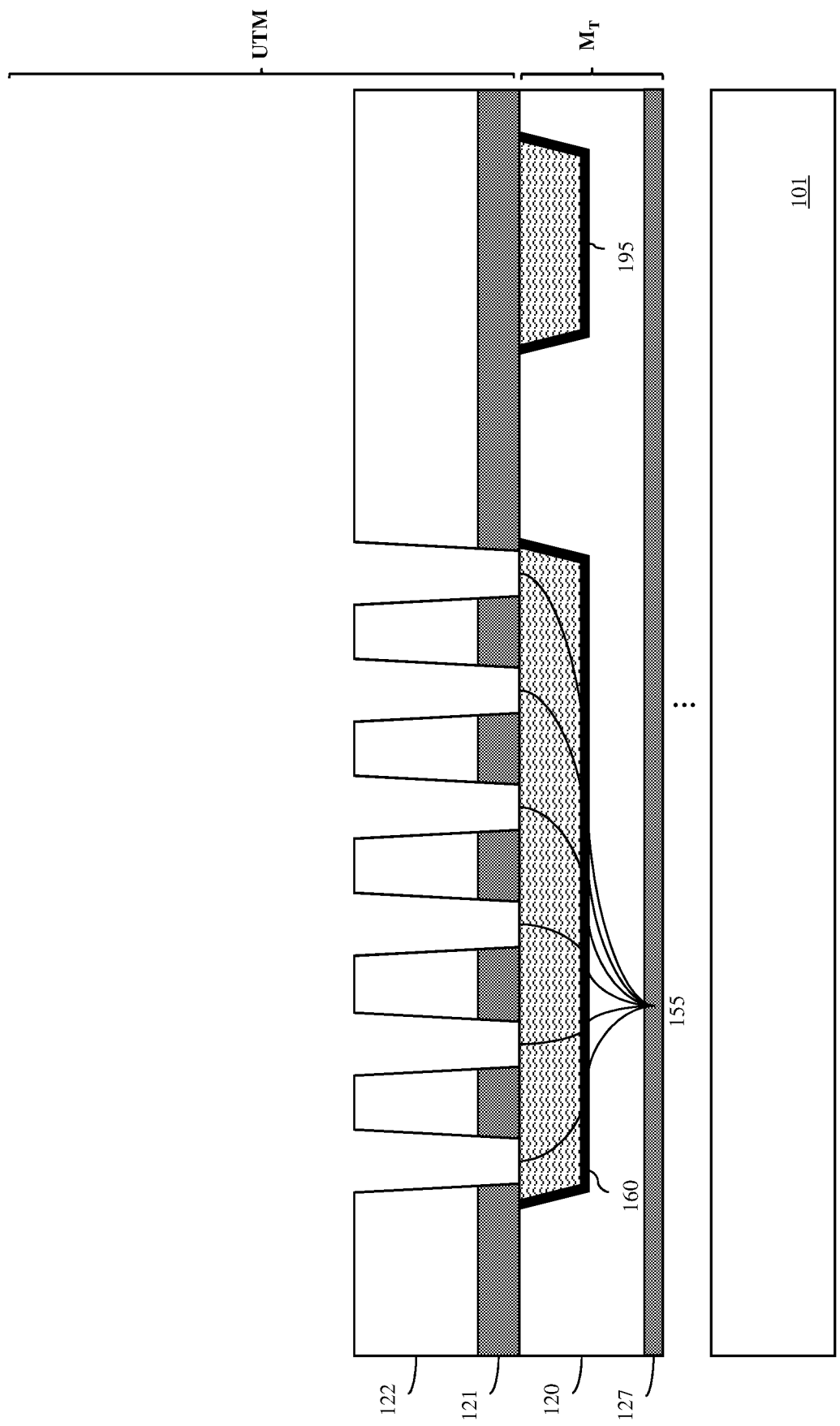

Specifically, formation of the UTM level at process step 312 can include depositing a first dielectric layer 121 and depositing a second dielectric layer 122 on the first dielectric layer 121 (see process step 321 and FIG. 5). The first dielectric layer 121 can be, for example, a barrier low-K dielectric layer (e.g., a dielectric layer of amorphous, hydrogenated, silicon carbide or a BloK™ layer) or a dielectric layer of any other suitable low-K or ultra-low-K dielectric material. The second dielectric layer 122 can be, for example, a TEOS silicon dioxide layer. In any case, these dielectric layers can be deposited so that the second dielectric layer 122 is relatively thick as compared to the first dielectric layer 121. For example, the first dielectric layer 121 can have a thickness ranging from approximately 50 to 100 nm and the second dielectric layer 122 can have a thickness ranging from approximately 500 to 1000 nm.

The MIMCAP 150 can then be formed in the first and second dielectric layers 121-122 of the UTM level (see process step 322). Specifically, trenches 155 can be formed (e.g., lithographically patterned and anisotrpically etched) such that they extend essentially vertically at least through the second dielectric layer 122 and the first dielectric layer 121 (see FIG. 5). Thus, the depth of each of these trenches 155 (as measured in the Y-direction) will be at least be equal to the combined thicknesses of the first dielectric layer 121 and the second dielectric layer 122 (i.e., ranging from approximately 550 to 1100 nm). The width of each of these these trenches 155 (as measured in the X-direction) can range, for example, from 100 to 400 nm Thus, each of the trenches 155 is formed so as to have a relatively high aspect ratio. The length of each of these trenches 155 (in the Z-direction not shown) can range, for example, from 10 to 200 μm.

Figure 6:
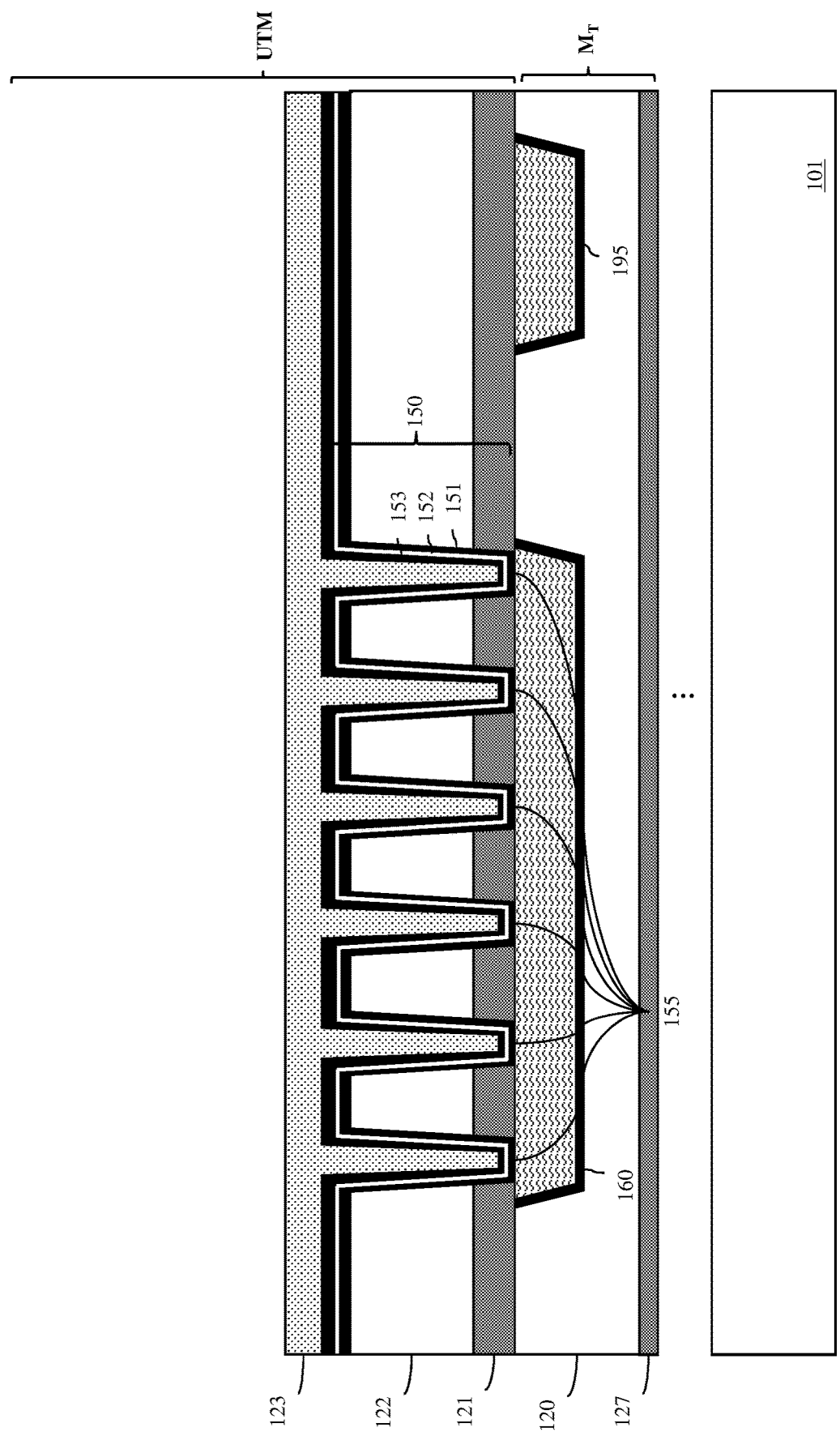
Figure 7:
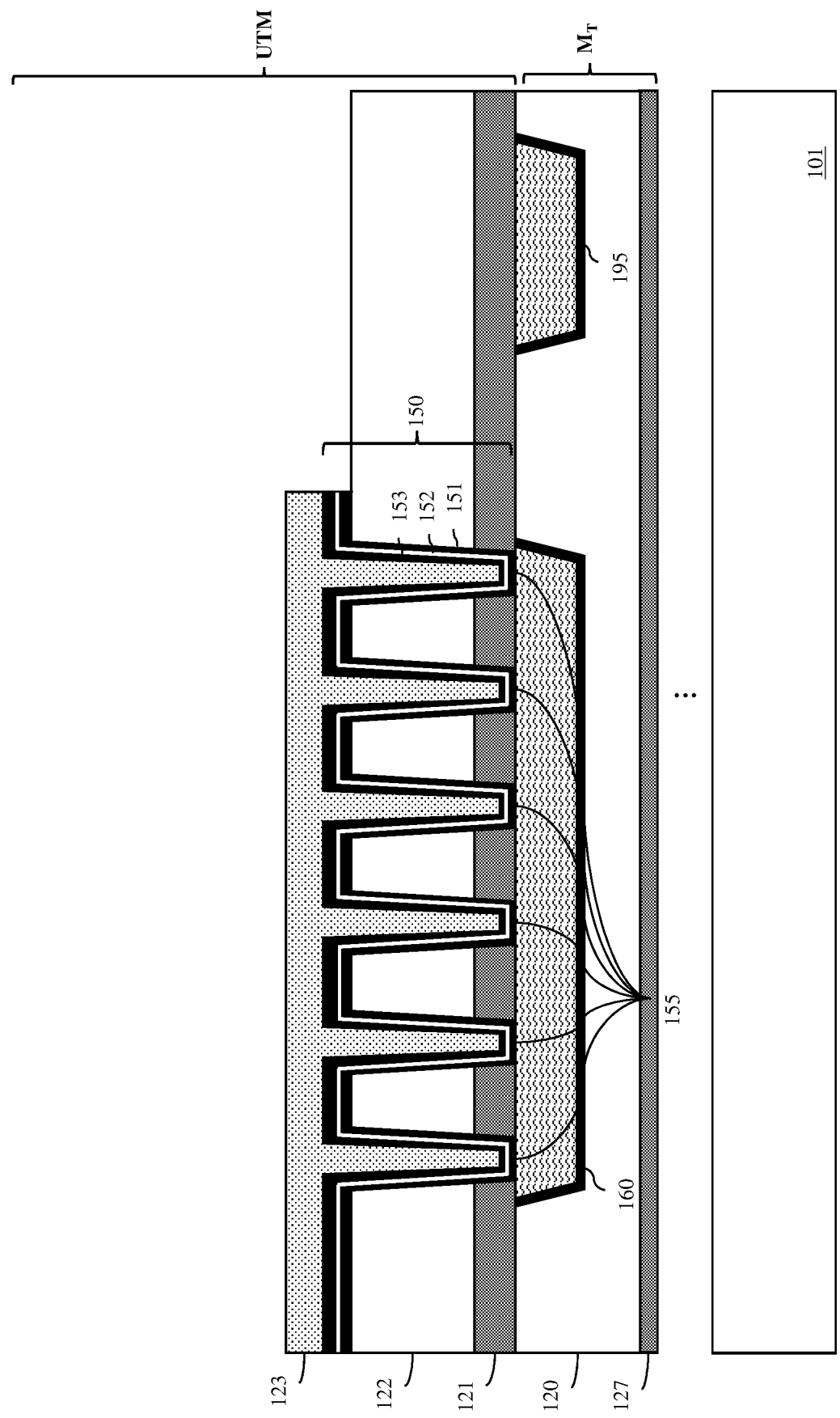

Next, a conformal metal-insulator-metal (MIM) stack can be deposited onto the top of the second dielectric layer 122 and so as to line the trenches 155 (see FIG. 6). Specifically, a first conformal metal layer 151 of a metal or metal alloy (e.g., titanium nitride, tantalum nitride, tungsten or any other suitable metal or metal alloy) can be conformally deposited (e.g., by chemical vapor deposition, plasma vapor deposition, or atomic layer deposition) so as to line the trenches 155. A conformal insulator layer 152 including at least one layer of a high-K dielectric material (e.g., an oxide of hafnium, zirconium, aluminum, or tantalum or any other suitable high-K dielectric material) can be conformally deposited (e.g., by atomic layer deposition or plasma-enhanced atomic layer deposition) onto the first conformal metal layer 151 so as to also line the trenches 155. A second conformal metal layer 153 of a metal or metal alloy (e.g., titanium nitride, tantalum nitride, tungsten or any other suitable metal or metal alloy) can be conformally deposited (e.g., by chemical vapor deposition, plasma vapor deposition, or atomic layer deposition) onto the conformal insulator layer so as to also line the trenches 155. It should be noted that the metal or metal alloy materials of the first and second conformal metal layers may be the same or different. In exemplary embodiments, where the trenches 155 are patterned and etched so as to have a width of 200-300 nm and a depth of 600 nm (e.g., given a 50 nm first dielectric layer and a 550 nm second dielectric layer), then the thickness of the first conformal metal layer 151 can be 30-50 nm, the thickness of the conformal insulator layer 152 can be 5-8 nm and the thickness of the second conformal metal layer 153, 253 can be 30-50 nm.

After deposition of the MIM stack, a third dielectric layer 123 and, particularly, a conformal third dielectric layer (e.g., a silicon nitride layer) can be deposited on the second conformal metal layer 153 so as to fill any remaining space within the trenches 155. The third dielectric layer 123 can be deposited so as to have a thickness of, for example, 30-70 nm (e.g., approximately 50 nm). Then, the third dielectric layer 123 and the portions of the MIM stack on the top surface of the second dielectric layer 122 can be lithographically patterned and anisotropically etched to define the outer edges and, thereby, the surface area of the MIMCAP 150 (see FIG. 7). It should be noted that, although not illustrated in the FIG. 7, etching of the third dielectric layer and MIM stack may result in a slight recessing of the exposed top surface of the second dielectric layer 122.

Figure 8:
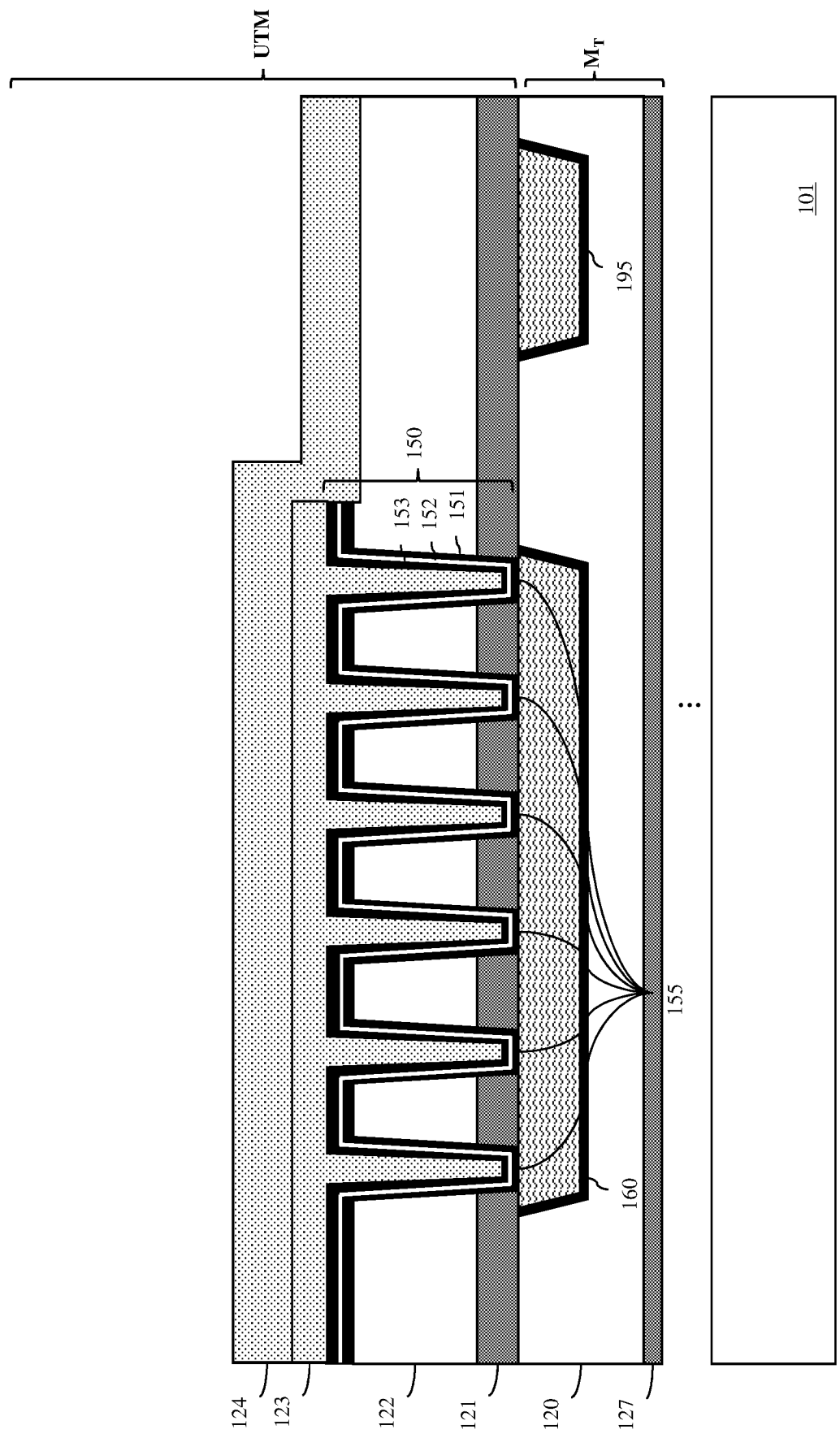
Figure 9:
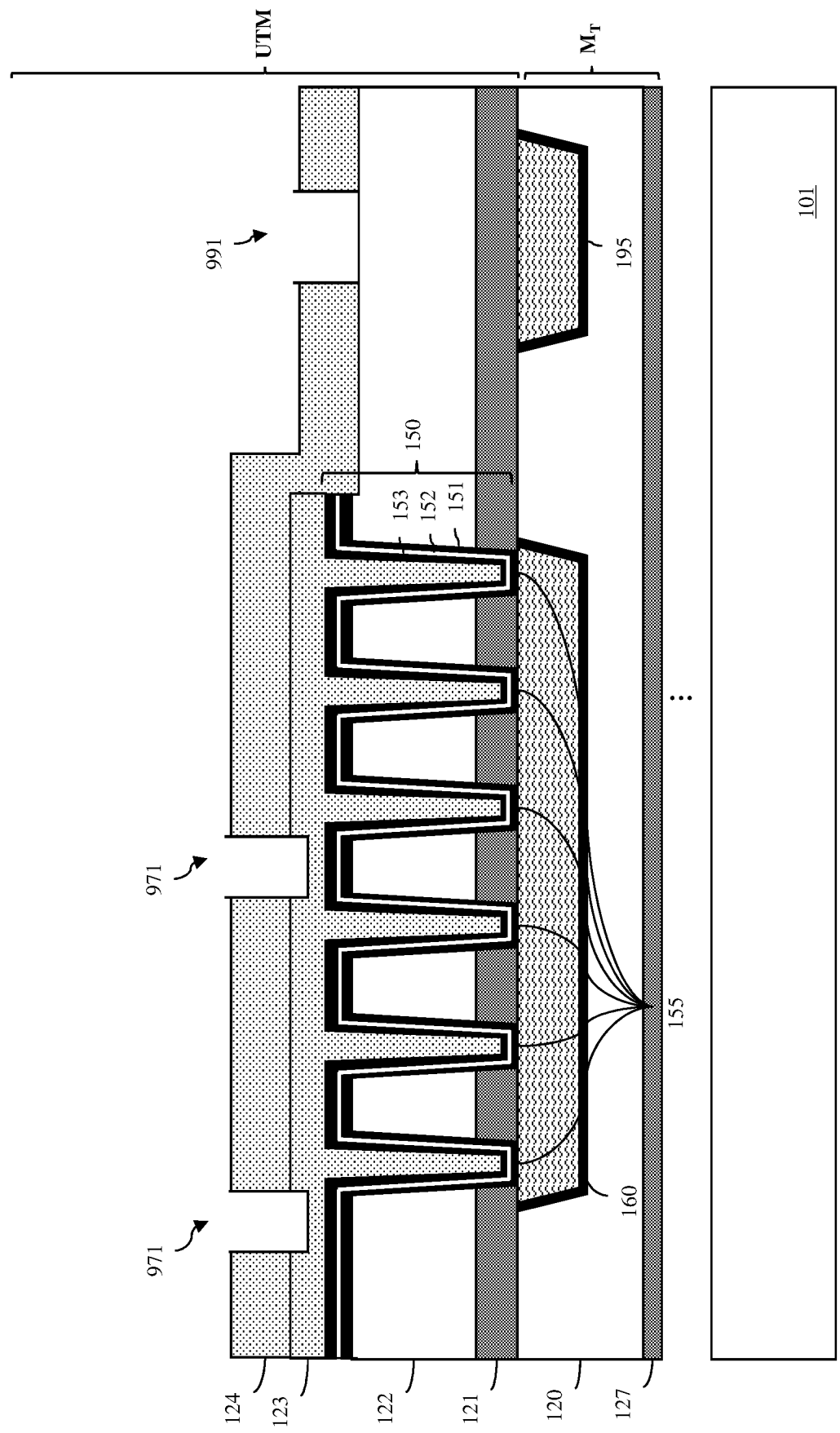

Formation of the UTM level can further include deposition of a fourth dielectric layer 124 and, particularly, a conformal fourth dielectric layer so as to cover the top surface of the third dielectric layer 123 and the exposed top surface of the second dielectric layer 122 (see process step 323 and FIG. 8). The fourth dielectric layer 124 can be made of the same dielectric material as the third dielectric layer 123. That is, the fourth dielectric layer 124 can be another silicon nitride layer. Furthermore, the fourth dielectric layer 124 can be deposited so that it is thicker than the third dielectric layer 123. That is, the fourth dielectric layer 124 can be deposited so as to have a thickness of, for example, 100-200 nm (e.g., approximately 120 nm).

During subsequent dual-damascene processing, this fourth dielectric layer 124 can be used for a buried via hole mask. Specifically, via holes 971 and 991 for dual-damascene structures within the UTM level, including a dual-damascene top electrode contact and an additional dual-damascene interconnect structure, respectively, can be lithographically patterned and anisotrpically etched through the fourth dielectric layer 124 (see process step 324 and FIG. 9). The lithographic patterning and etch processes can be performed such that at least one via hole 971 for the dual-damascene top electrode contact extends through the fourth dielectric layer 124 and is aligned vertically above at least one portion of the MIMCAP 150 on the top surface of the second dielectric layer 122. Additionally, the lithographic patterning and etch processes can be performed such that at least one additional via hole 991 for the additional dual-damascene interconnect structure extends through the fourth dielectric layer 124, lands on the top surface of the second dielectric layer 122, and is aligned above the additional metal interconnect 195. As illustrated, etching should stop when the top surface of the second dielectric layer 122 within the additional via hole 991 is exposed and may result in the via hole(s) 971 for the dual-damascene top electrode contact extending at least partially into the third dielectric layer 123.

Figure 10:
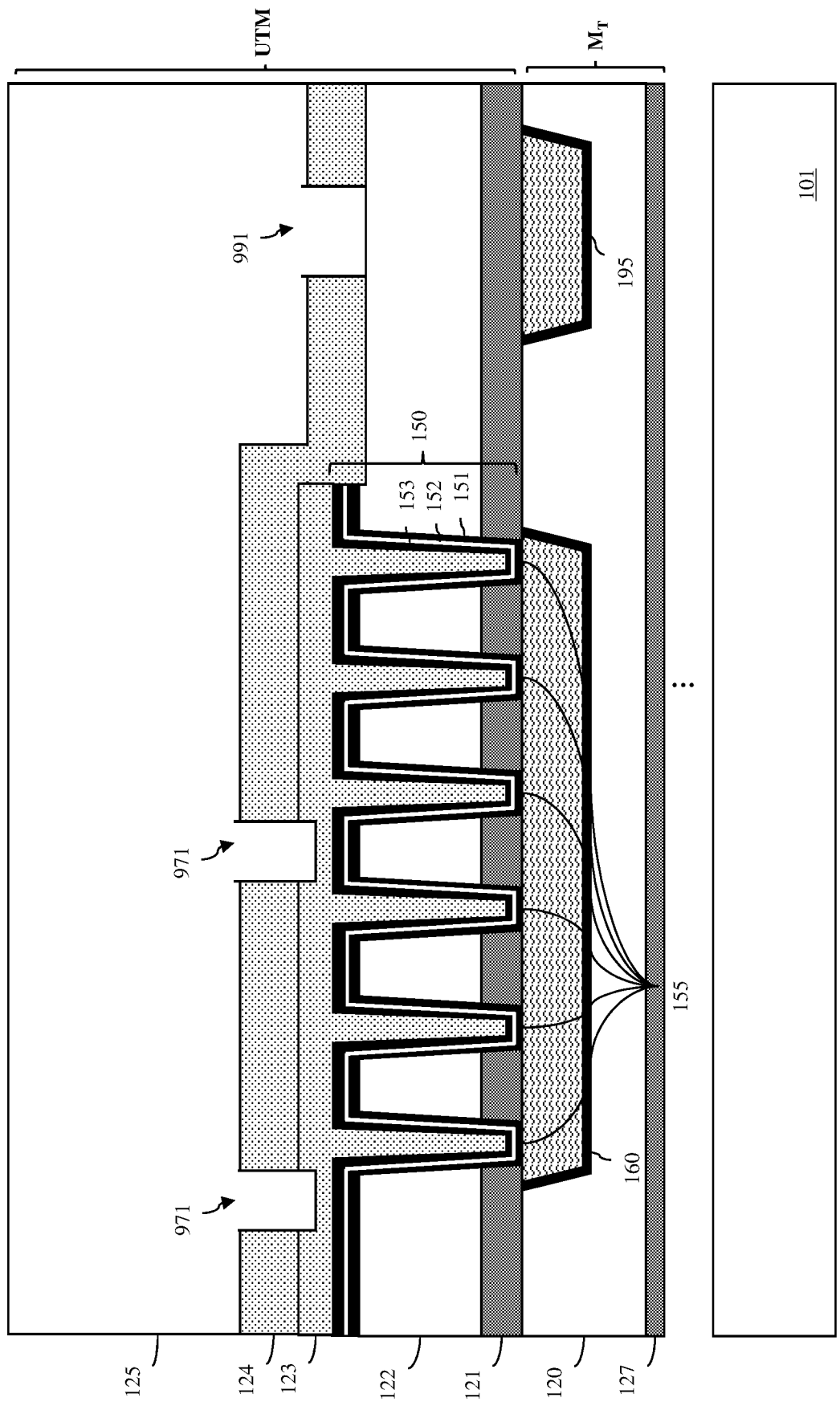

Formation of the UTM level can further include deposition of a fifth dielectric layer 125 and, particularly, a blanket fifth dielectric layer over the fourth dielectric layer 124 so as to fill the via holes 971 and 991 (see process step 325 and FIG. 10). A polishing process (e.g., a CMP process) can then be performed such that the top surface of the fifth dielectric layer is essentially planar. The fifth dielectric layer 125 can be the uppermost dielectric layer in the UTM level and can be, for example, another TEOS silicon dioxide layer. In any case, this fifth dielectric layer 125 can be deposited and polished so that it remains relatively thick and so that the UTM level has a desired thickness of at least 3 μm. For example, polishing can be performed such that the minimum thickness of the fifth dielectric layer 125 in the region above the MIMCAP 150 is greater than 2500 nm and further such that the overall thickness of the UTM level will be approximately 4 μm from the bottom surface of the first dielectric layer 121 to the top surface of the fifth dielectric layer 125.

Figure 11:
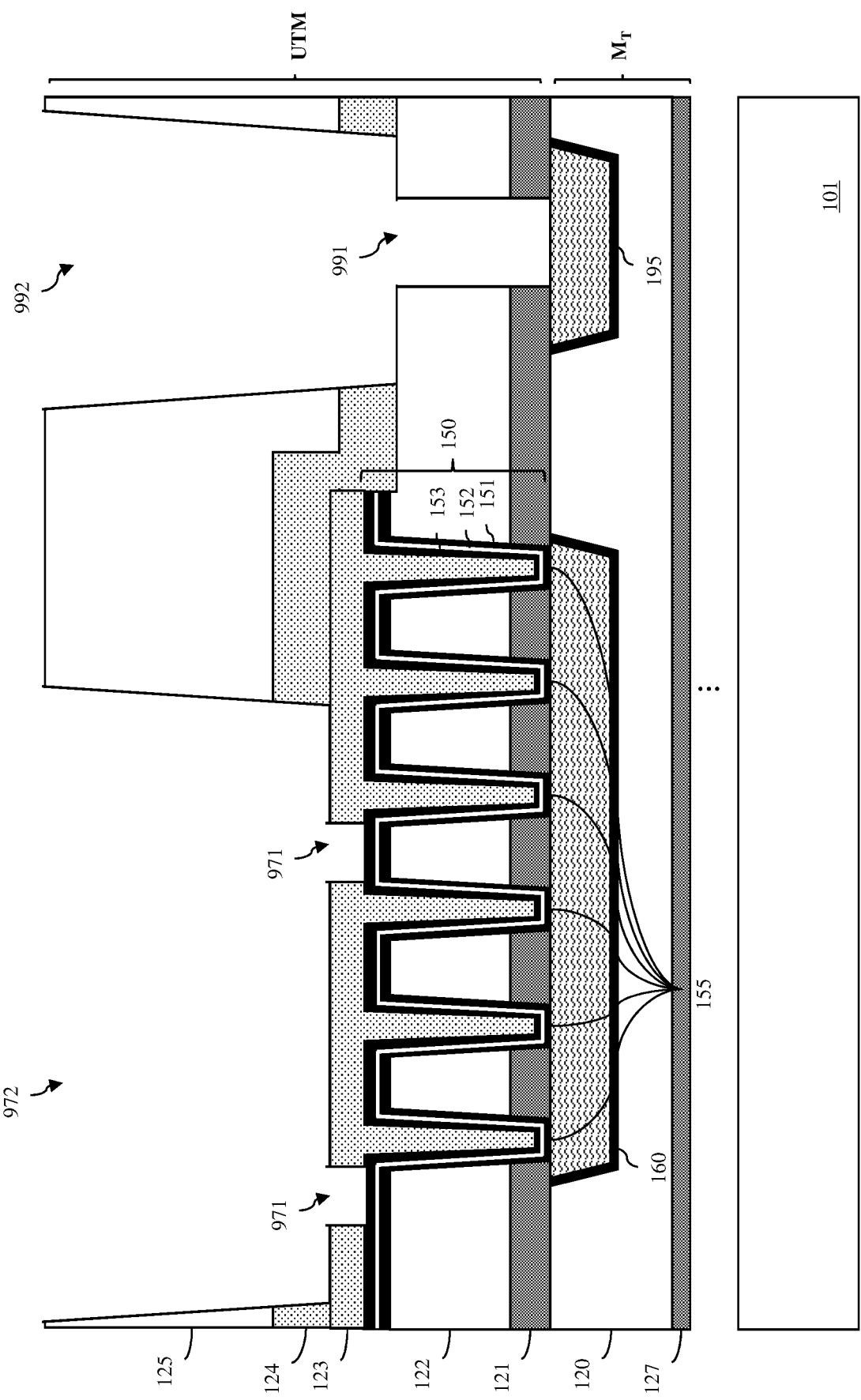

After the fifth dielectric layer 125 is deposited, wire trenches 972 and 992 for the dual-damascene top electrode contact and the additional dual-damascene interconnect structure can be lithographically patterned and anisotropically etched in the fifth dielectric layer 125 and fourth dielectric layer 124 so as to be aligned above the via holes 971 and 991, respectively (see process step 326 and FIG. 11). Specifically, the lithographic patterning and etch processes can be performed such that a wire trench 972 for the dual-damascene top electrode contact is aligned above the via hole(s) 971 and extends from the top surface of the fifth dielectric layer 125 into or through the fourth dielectric layer 124. Additionally, the lithographic patterning and etch processes can be performed such that at least one additional wire trench 992 for the additional dual-damascene interconnect structure is aligned above the additional via hole 991 and extends from the top surface of the fifth dielectric layer 125 to the top surface of the second dielectric layer 122. As illustrated, the etch process will be performed so that via hole(s) 971 for the dual-damascene top electrode are further extended downward completely through the third dielectric layer 123, thereby exposing the top surface of the second conformal metal layer 153 (i.e., the top electrode). The etch process will also be performed so that the additional via hole 991 for the dual-damascene interconnect structure 190 is extended downward completely through the second dielectric layer 122, thereby exposing the top surface of the additional metal element 195. It should be noted that this etch process can be selective for the silicon dioxide of the second dielectric layer 122 over the silicon nitride of the third dielectric layer 123 so that the etch rate of the silicon dioxide is faster than that of the silicon nitride. This etch process should also be highly selective for the silicon dioxide of the second dielectric layer 122 over the metal or metal alloys of the MIMCAP to prevent damage to these materials when exposed. Etch processes that are selective for silicon dioxide over silicon nitride and that are highly selective for silicon oxide over metal are well known in the art and, thus, the details of these etch processes have been omitted from the specification in order to allow the reader to focus on the salient aspects of the disclosed method.

Finally, a metallization process can be performed so as to line the wire trenches 972 and 992 and the via hole(s) 971 and 991 below with diffusion barrier and/or adhesion layers and then to fill those trenches with a metal or metal alloy conductor (see process step 327 and the embodiment 100A of the IC structure shown in FIG. 1A). A polishing process (e.g., a CMP process) can then be performed so as to remove any conductive material from above the top surface of the fifth dielectric layer. The metallization process results in a dual-damascene top electrode contact 170 in the upper portion of the UTM level above the MIMCAP 150 with a metal wire 172 in the wire trench 972 and via interconnect(s) 171 in the via hole(s) 971. As illustrated, the bottom surface of the via interconnects 171 at the bottoms of the via hole(s) 971 are in contact with the top surface of the second conformal metal layer 153. The metallization process also results in an additional dual-damascene interconnect structure 190, which includes: an additional metal wire 192 in the additional wire trench 992 and positioned laterally adjacent to the dual-damascene top electrode contact; and an additional via interconnect 191 in the additional via hole 991 and positioned laterally adjacent to the MIMCAP 150. As illustrated, the bottom surface of the via interconnect 191 at the bottom of the additional via hole 991 is in contact with the top surface of the additional metal element 195.

Figure 1B:
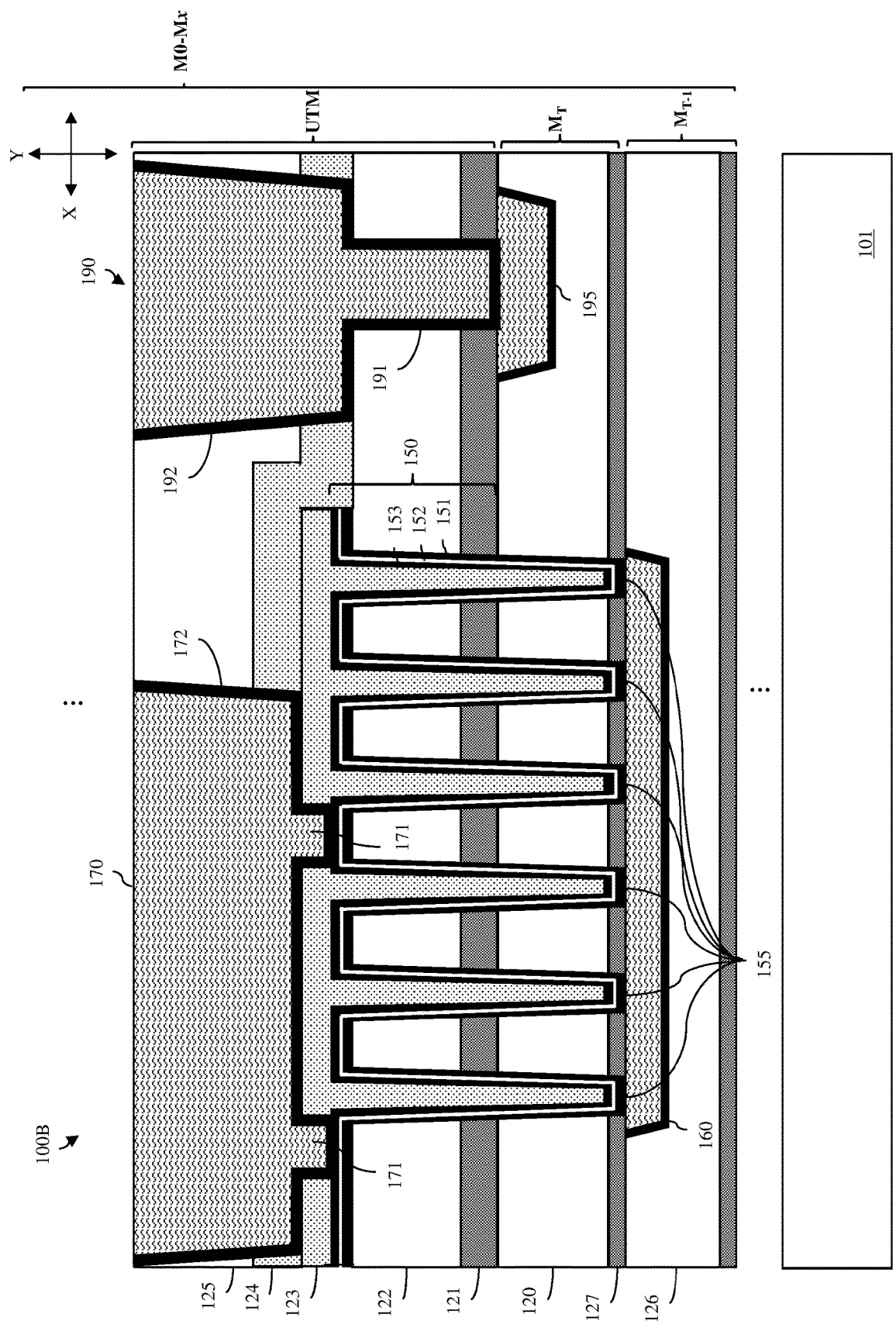
Figure 1C:
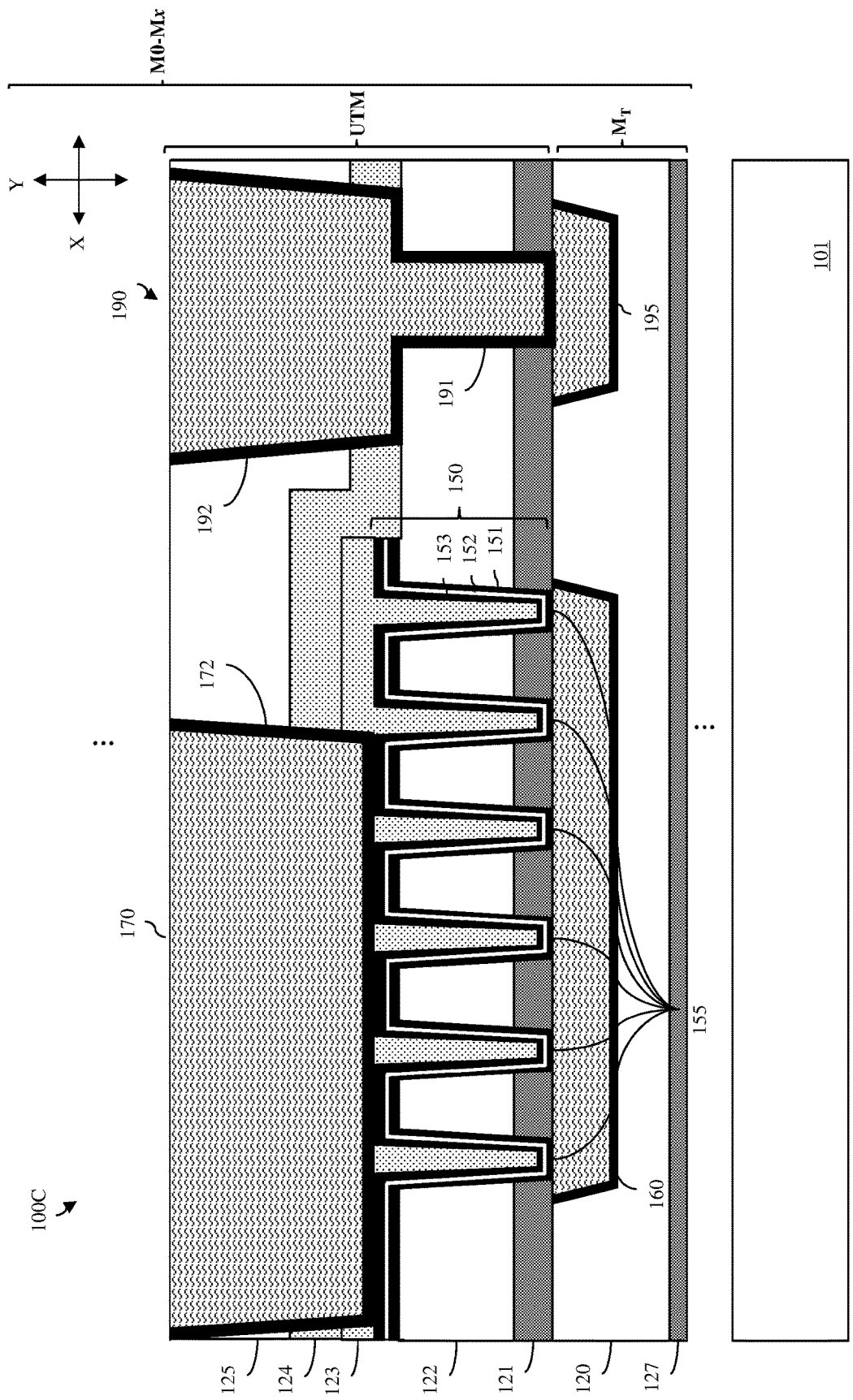

It should be understood that one or more additional and/or alternative process steps to those set forth in the flow diagram of FIG. 3 could be performed in order to form the embodiments 100B and 100C of the IC structure shown in FIGS. 1B and IC, respectively. For example, during process step 310, the wire bottom electrode contact 160 can be formed in some metal level below the top standard metal (i.e., below $M_T$) and, during MIMCAP 150 formation, the trenches 155 can be etched so that they extend completely through the $M_T$ metal level (e.g., down to the wire bottom electrode contact 160 in the TEOS silicon dioxide layer 126 within the $M_{T-1}$ metal level) (see FIG. 12). The remaining process steps will then result in the embodiment 100B of the IC structure shown in FIG. 1B. Additionally, instead of forming the top electrode contact 170 as a dual-damascene top electrode contact, it can be formed at process step 312 as a wire top electrode contact. In this case, only the via hole 991 would be lithographically patterned and etched into the fourth dielectric layer 124 at process step 324 (see FIG. 13). Subsequently, a wire trench 972 would be formed at process step 326 so that it extends from the top surface of the fifth dielectric layer 125 down to the bottom surface of the third dielectric layer 123, thereby exposing the top surface of the second conformal metal layer 153 (see FIG. 14). In this case, metallization at process step 327 will result in a wire top electrode contact in direct contact with the top surface of the second conformal metal layer 153 and the embodiment 100C of the IC structure shown in FIG. 1C.

Figure 2A:
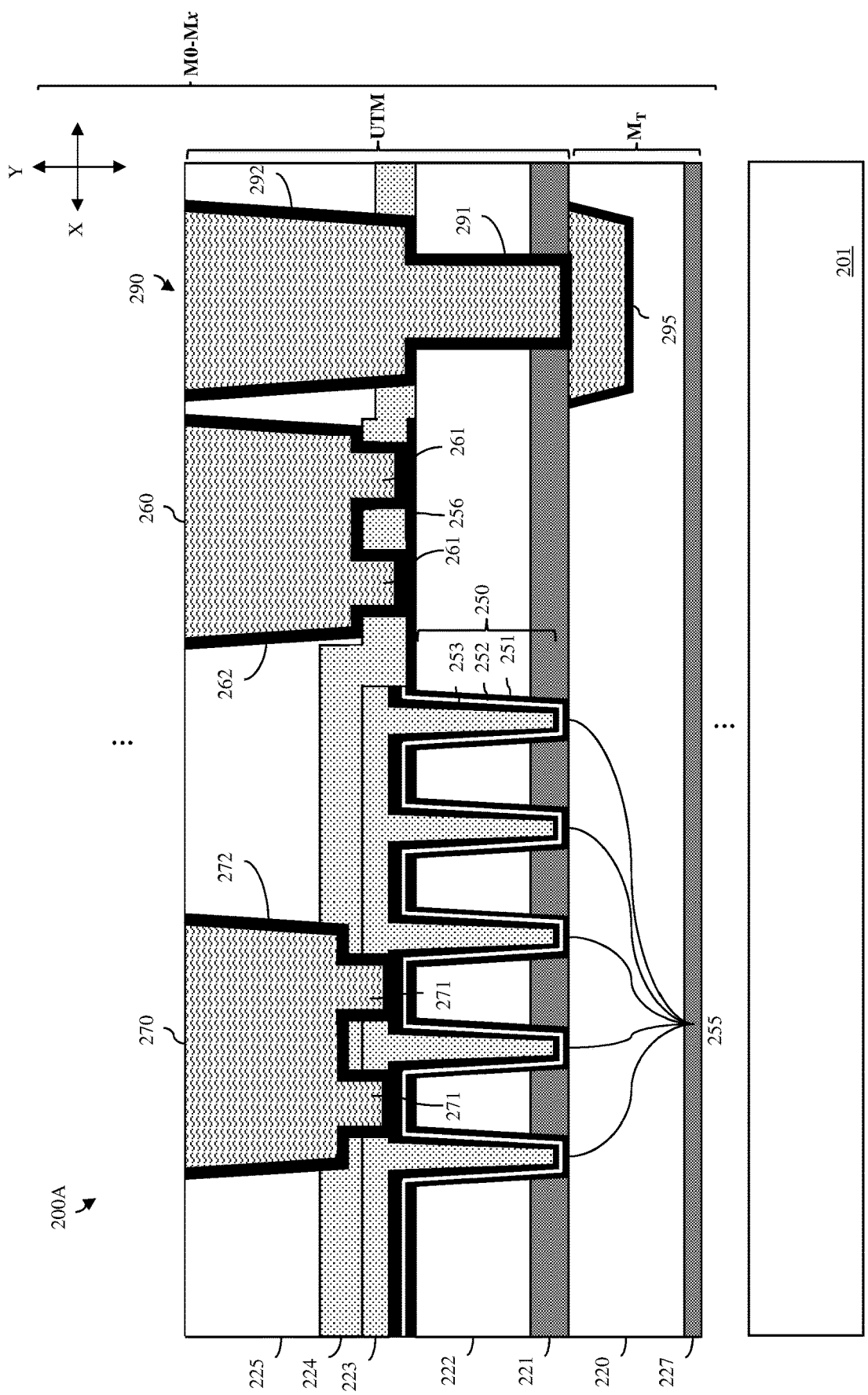
FIGS. 2A-2C are cross-section diagrams of alternative configurations of an embodiment of an integrated circuit (IC) structure that incorporates an ultra-thick metal (UTM) level three-dimensional (3D) metal-insulator-metal capacitor (MIMCAP), an above-MIMCAP bottom electrode contact and an above-MIMCAP top electrode contact.
Figure 16:
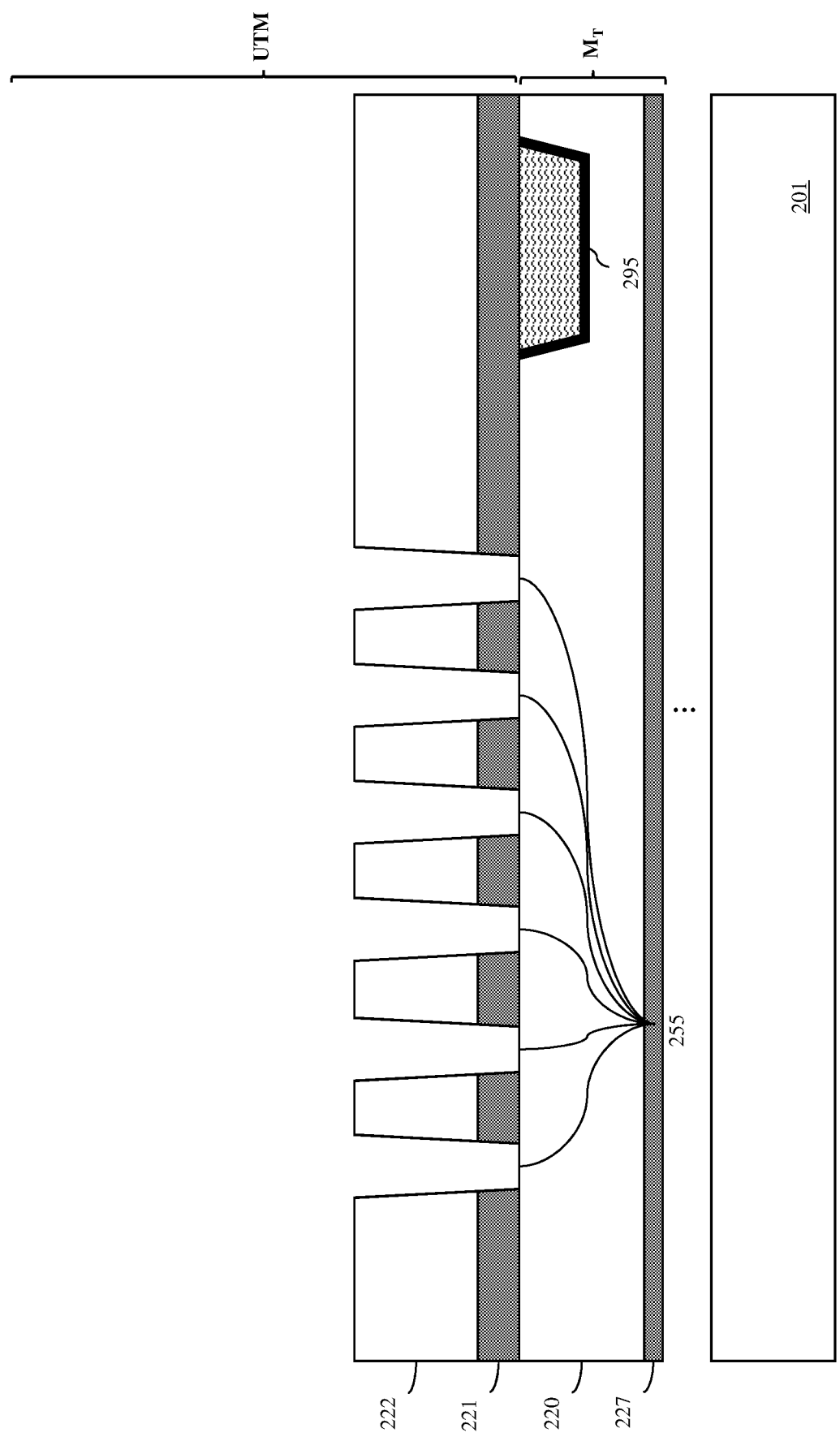
FIGS. 16-23 are cross-section diagrams of partially completed IC structures formed according to the flow diagram of FIG. 15.
Figure 17:
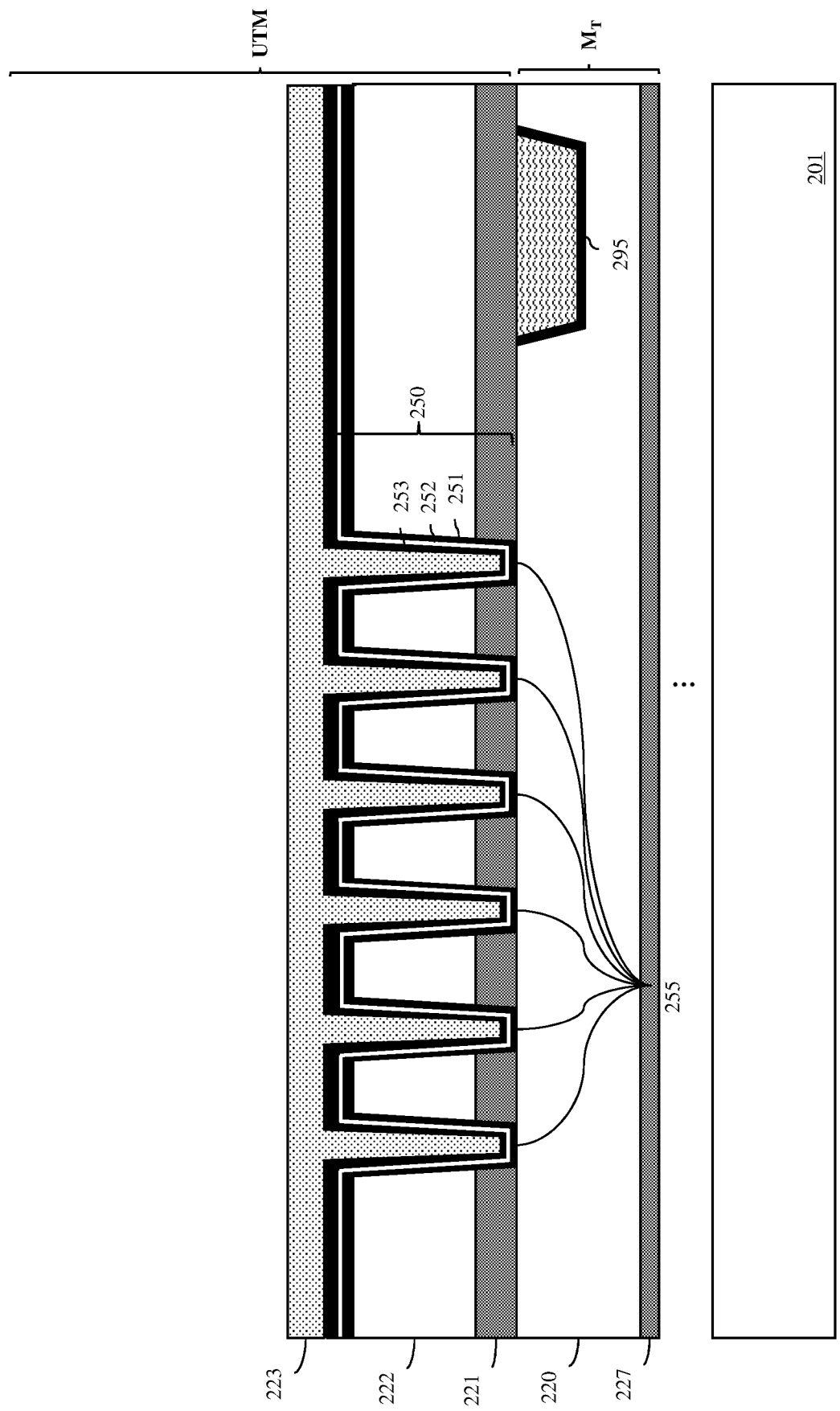

Referring specifically to the flow diagram of FIG. 15 and the process steps for forming the embodiment 200A of the IC structure shown in FIG. 2A, process step 410 can include forming standard metal levels including a bottom standard metal level (M0) (not shown), which is the lowermost metal level closest to the substrate 201, up to a top standard metal level ($M_T$), which is the uppermost standard metal level and farthest from the substrate 201 (see FIG. 16). Formation of each of the standard metal levels can include formation of multiple dielectric layers including a thin barrier low-K dielectric layer and a thick silicon dioxide layer (e.g., see the layers 227 and 220 of the top standard metal level ($M_T$) shown in FIG. 16). The thin barrier low-K dielectric layer can be, for example, a dielectric layer of amorphous, hydrogenated, silicon carbide or a BloK™ layer, or a dielectric layer of any other suitable low-K dielectric material or ultra-low K material For purposes of this disclosure, a low-K dielectric material refers to a dielectric material with a dielectric constant that is less than 3.9 and an ultra-low K material refers to a dielectric material with a dielectric constant of less than 2.5. The thick silicon dioxide layer can be a TEOS silicon dioxide layer. Those skilled in the art will recognize that a TEOS silicon dioxide layer is a silicon dioxide layer deposited by plasma-enhanced chemical vapor deposition (PECVD) using tetraethyl orthosiliciate (TEOS) as the silicon source.

Process step 410 can further include forming one or more metal elements in the standard metal levels including, for example, a metal element 295 in the top standard metal level ($M_T$), as illustrated. For example, a wire trench can be lithographically patterned and anisotropically etched into the top surface of the TEOS silicon dioxide layer 220 of the metal level $M_T$. A metallization process can then be performed so as to line the trench with diffusion barrier and/or adhesion layers and to fill the trench with a metal or metal alloy conductor. A polishing process (e.g., a CMP process) can then be performed so as to remove any conductive material from above the top surface of the TEOS silicon dioxide layer 220, thereby forming the additional metal element 295.

Process step 412 can include forming an ultra-thick metal (UTM) level above the top standard metal level ($M_T$) such that this UTM level includes a metal-insulator-metal capacitor (MIMCAP) 250 in a lower portion of the UTM level, a dual-damascene top electrode contact 270 in an upper portion of the UTM level above the MIMCAP 250, a dual-damascene bottom electrode contact 260 in the upper portion of the MIMCAP 250 and, optionally, an additional dual-damascene interconnect structure 290 positioned laterally adjacent to the MIMCAP 250 and the electrode contacts 270, 260 thereon.

Specifically, formation of the UTM level at process step 412 can begin with essentially the same process steps and materials described in detail above with regard to processes 321-322 (unless otherwise noted). That is, the method can include depositing a first dielectric layer 221 (e.g., a 50-100 nm low-k dielectric layer) and depositing a second dielectric layer 222 (e.g., a 500-100 nm TEOS silicon dioxide layer) on the first dielectric layer 221 (see process step 421 and FIG. 16).

The MIMCAP 250 can then be formed in the first and second dielectric layers 221-222 of the UTM level (see process step 422). Specifically, trenches 255 can be formed (e.g., lithographically patterned and anisotrpically etched) such that they extend essentially vertically at least through the second dielectric layer 222 and the first dielectric layer 221 (see FIG. 16). Next, a conformal metal-insulator-metal (MIM) stack can be deposited onto the top of the second dielectric layer 222 and so as to line the trenches 255 (see FIG. 17). Specifically, a first conformal metal layer 251 of a metal or metal alloy (e.g., titanium nitride, tantalum nitride, tungsten or any other suitable metal or metal alloy) can be conformally deposited (e.g., by chemical vapor deposition, plasma vapor deposition, or atomic layer deposition) so as to line the trenches 255. A conformal insulator layer 252 including at least one layer of a high-K dielectric material (e.g., an oxide of hafnium, zirconium, aluminum, or tantalum or any other suitable high-K dielectric material) can be conformally deposited (e.g., by atomic layer deposition or plasma-enhanced atomic layer deposition) onto the first conformal metal layer 251 so as to also line the trenches 255. A second conformal metal layer 253 of a metal or metal alloy material (e.g., titanium nitride, tantalum nitride, tungsten or any other suitable metal or metal alloy) can be conformally deposited (e.g., by chemical vapor deposition, plasma vapor deposition, or atomic layer deposition) onto the conformal insulator layer so as to also line the trenches 255. The second conformal metal layer 253 may be the same material as the first conformal metal layer 251 or a different material. In exemplary embodiments, where the trenches 255 are patterned and etched so as to have a width of 200-300 nm and a depth of 600 nm (e.g., given a 50 nm first dielectric layer and a 550 nm second dielectric layer), then the thickness of the first conformal metal layer 151 can be 30-50 nm, the thickness of the conformal insulator layer 152 can be 30-40 nm and the thickness of the second conformal metal layer 153, 253 can be 30-50 nm.

After deposition of the MIM stack, a third dielectric layer 223 and, particularly, a conformal third dielectric layer (e.g., a silicon nitride layer) can be deposited on the second conformal metal layer 253 so as to fill any remaining space within the trenches 255.

Figure 18:
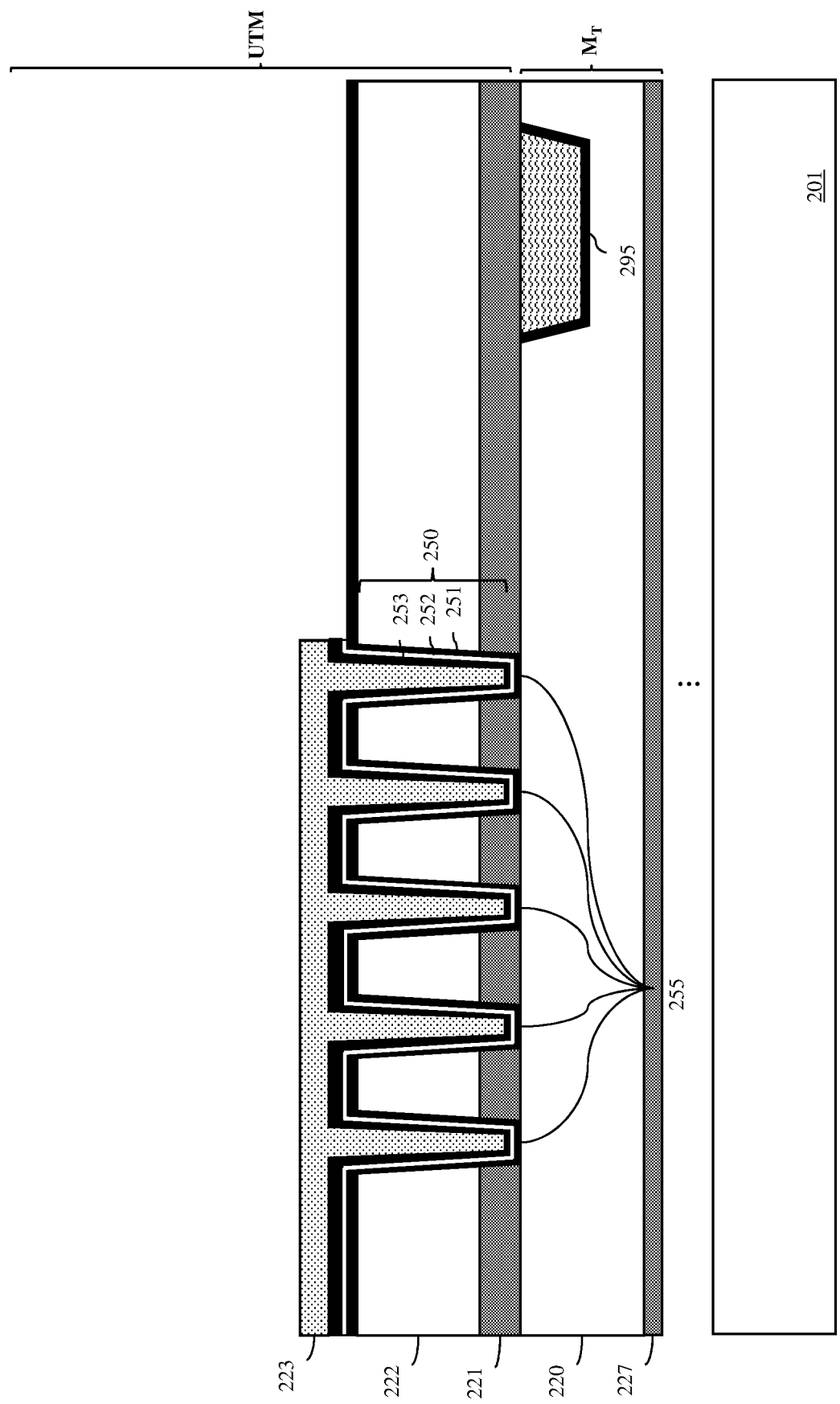
Figure 19:
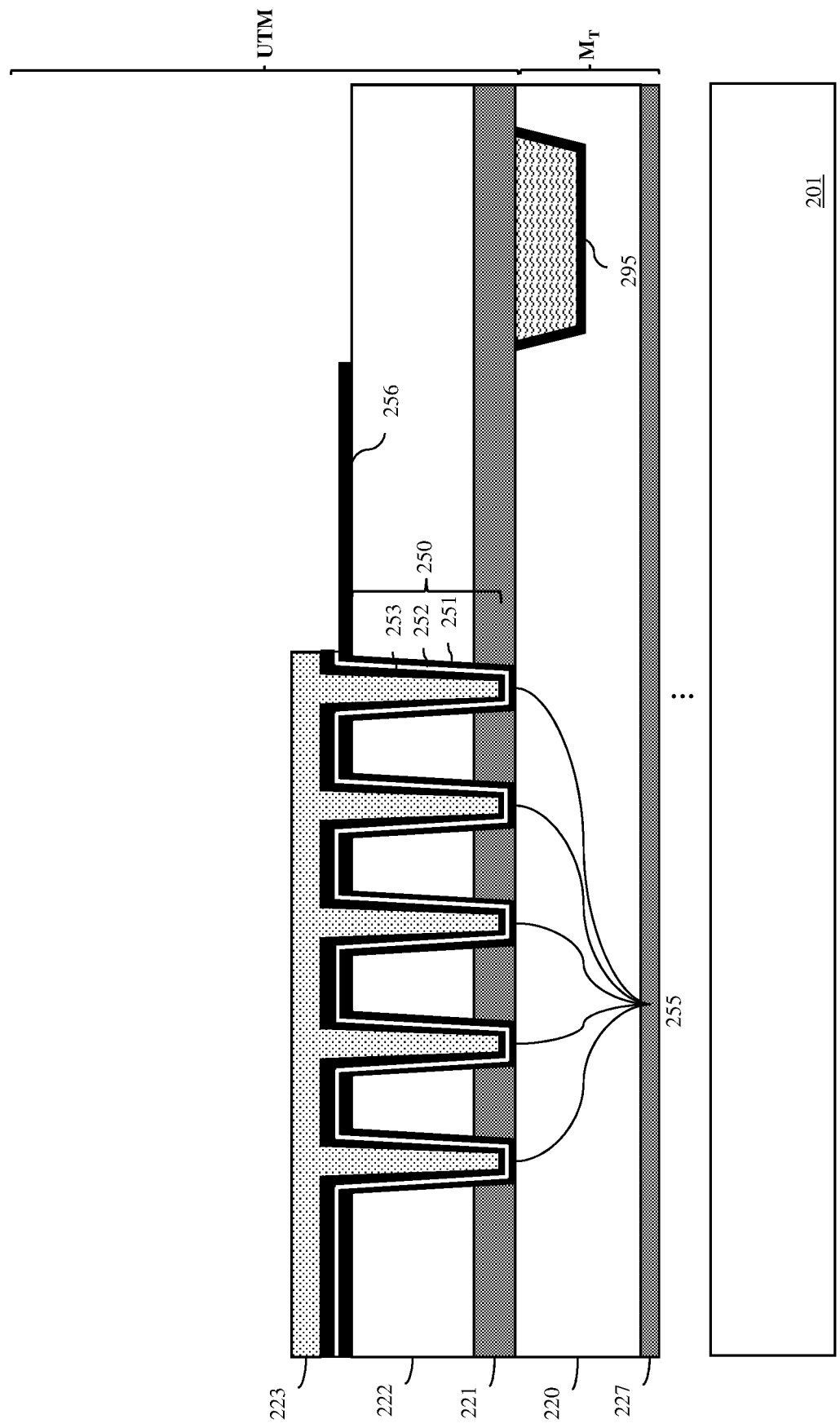

Then, the third dielectric layer 223 and the portions of the MIM stack on the top surface of the second dielectric layer 222 can be lithographically patterned and etched to define the outer edges and, thereby, the surface area of the MIM-CAP 250 (see FIGS. 18-19). In this embodiment, however, instead of performing a patterning step where sidewalls of all the MIMCAP layers and the third dielectric layer at the outer edges are all vertically aligned as in the previously performed to define the outer edges of the MIMCAP and to further ensure that at least one end 256 of the first conformal metal layer 253 extends laterally beyond the other layers in the MIMCAP (i.e., beyond the conformal insulator layer 252 and the second conformal metal layer 253) and the third dielectric layer 223. It should be noted that, although not illustrated in the FIG. 19, etching of the third dielectric layer and MIM stack may result in a slight recessing of the exposed top surface of the second dielectric layer 222.

Figure 20:
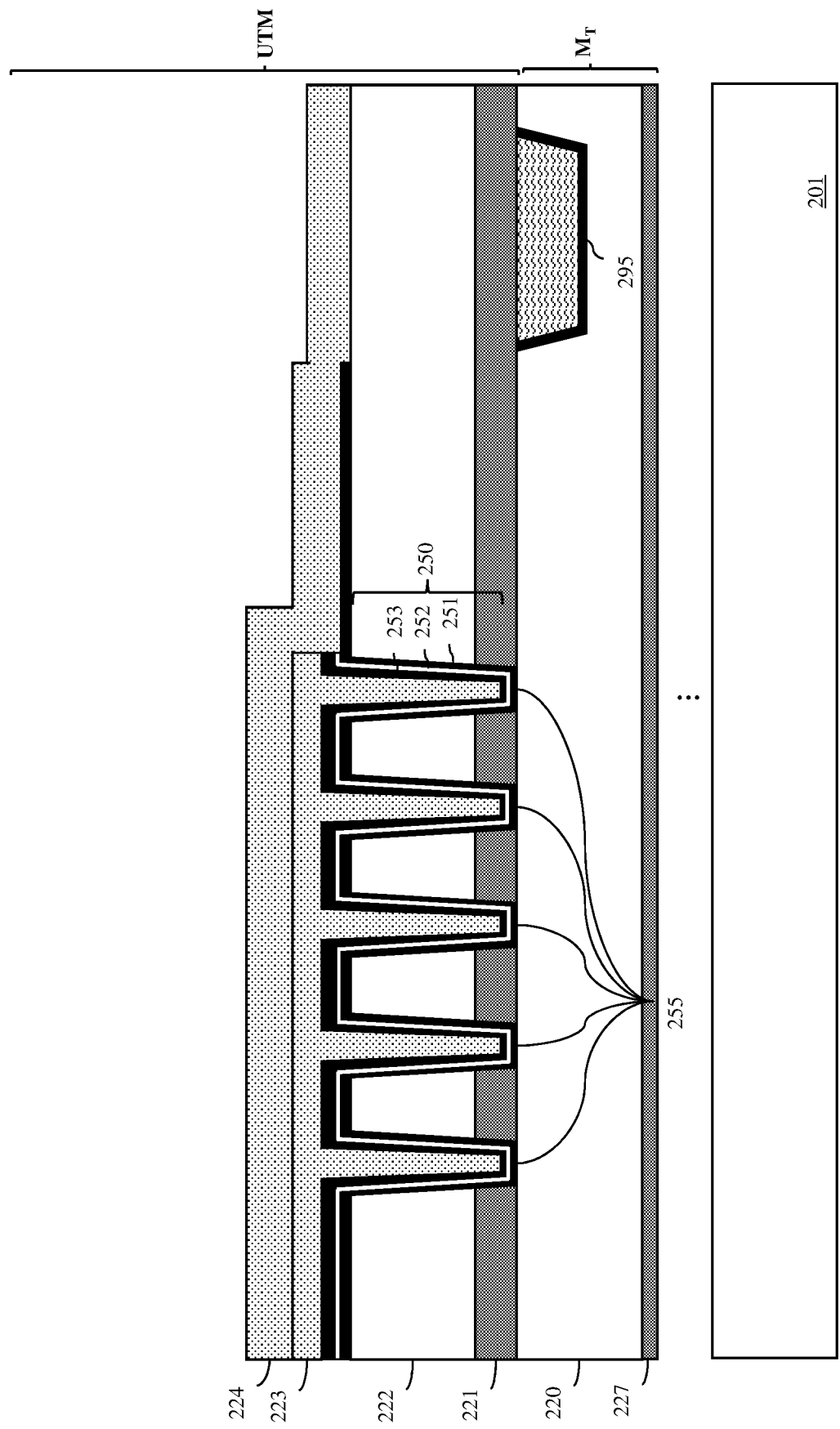
Figure 21:
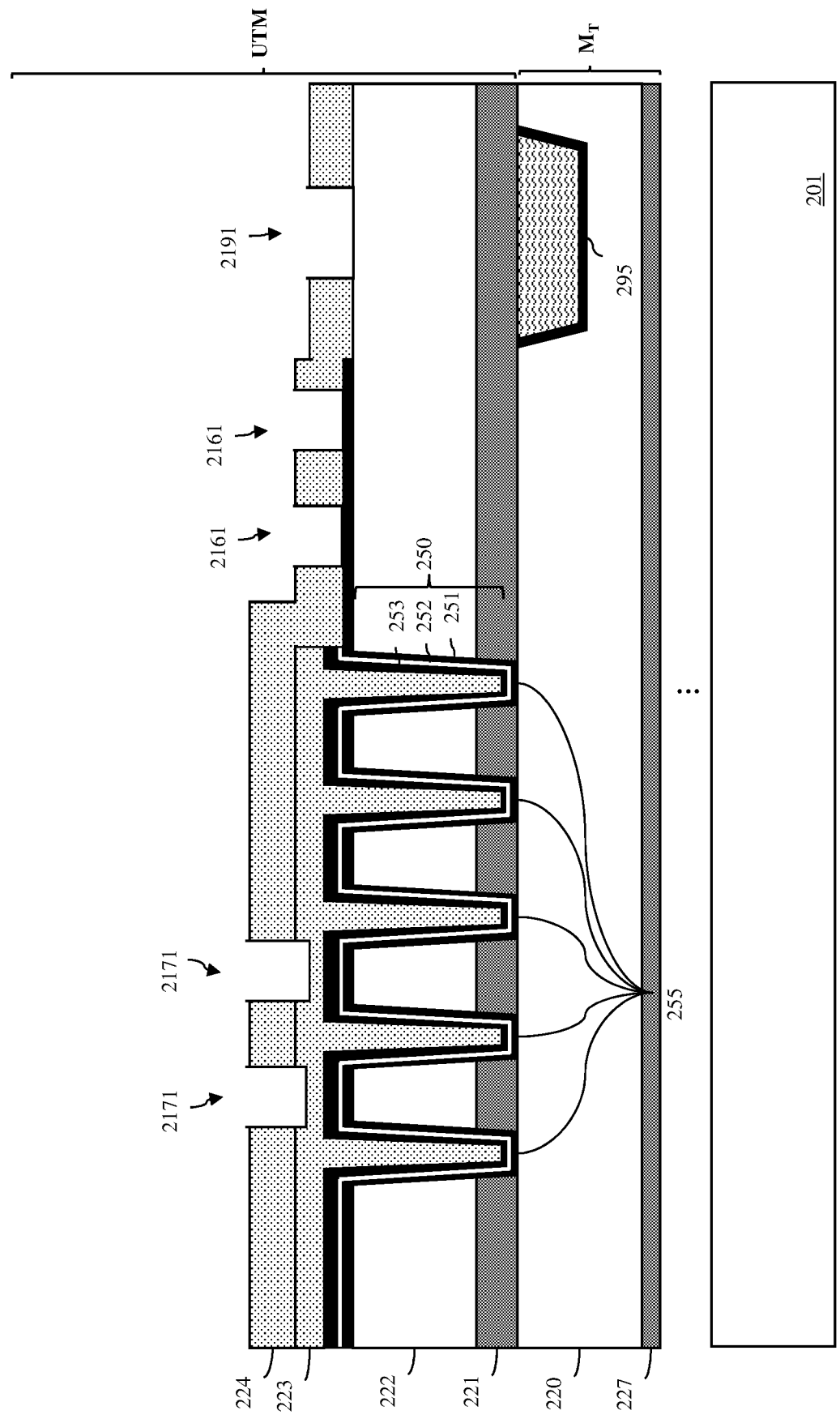

Formation of the UTM level can further include deposition of a fourth dielectric layer 224 and, particularly, a conformal fourth dielectric layer so as to cover the top surface of the third dielectric layer 223, the exposed end of the first conformal metal layer 251 and the exposed top surface of the second dielectric layer 222 (see process step 423 and FIG. 20). The fourth dielectric layer 224 can be made of the same dielectric material as the third dielectric layer 223 (e.g., silicon nitride). Furthermore, the fourth dielectric layer 224 can be deposited so that it is thicker than the third dielectric layer 223. That is, the fourth dielectric layer 224 can be deposited so as to have a thickness of, for example, 100-200 nm (e.g., approximately 150 nm).

During subsequent dual-damascene processing, this fourth dielectric layer 224 can be used for a buried via hole mask. Specifically, via holes 2171, 2161 and 2191 for dual-damascene structures within the UTM level, including a dual-damascene top electrode contact, a dual damascene bottom electrode contact, and an additional dual-damascene interconnect structure, respectively, can be lithographically patterned and anisotropically etched through the fourth dielectric layer 224 (see process step 424 and FIG. 21). The lithographic patterning and etch processes can be performed such that at least one via hole 2171 for the dual-damascene top electrode contact extends through the fourth dielectric layer 224 and is aligned vertically above at least one portion of the MIMCAP 250 on the top surface of the second dielectric layer 222. The lithographic patterning and etch processes can be performed such that at least one via hole 2161 for the dual-damascene bottom electrode contact extends through the fourth dielectric layer 224, is aligned vertically above the end 256 of the first conformal metal layer 251, and exposes the top surface of the first conformal metal layer 251 at that end 256. Additionally, the lithographic patterning and etch processes can be performed such that at least one additional via hole 2191 for the additional dual-damascene interconnect structure extends through the fourth dielectric layer 224, lands on the top surface of the second dielectric layer 222, and is aligned above the additional metal interconnect 295. As illustrated, etching of the via holes should stop when the top surface of the first conformal metal layer 251 at the end 256 and the top surface of the second dielectric layer 222 are exposed and may result in the via hole(s) 2171 for the dual-damascene top electrode contact extending at least partially into the third dielectric layer 223.

Figure 22:
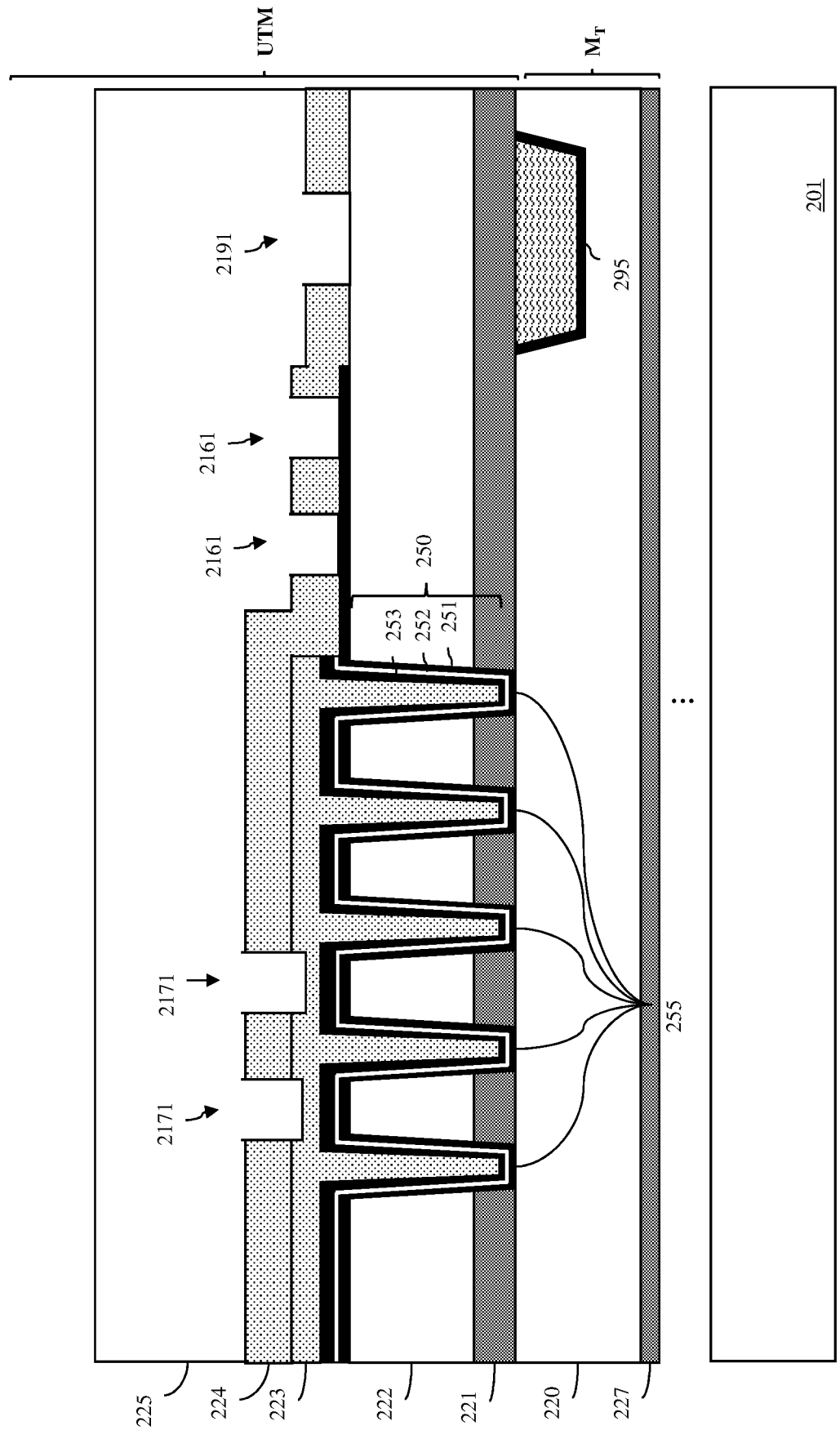

Formation of the UTM level can further include deposition of a fifth dielectric layer 225 and, particularly, a blanket fifth dielectric layer over the fourth dielectric layer 224 so as to fill the via holes 2171, 2161 and 2191 (see process step 425 and FIG. 22). A polishing process (e.g., a CMP process) can then be performed such that the top surface of the fifth dielectric layer is essentially planar. The fifth dielectric layer 225 can be the uppermost dielectric layer in the UTM level and can be, for example, another TEOS silicon dioxide layer. In any case, this fifth dielectric layer 225 can be deposited and polished so that it remains relatively thick and so that the UTM level has a desired thickness of at least 3 µm. For example, polishing can be performed such that the minimum thickness of the fifth dielectric layer 225 in the region above the MIMCAP 250 is greater than 2500 nm and further such that the overall thickness of the UTM level will be approximately 4 µm from the bottom surface of the first dielectric layer 221 to the top surface of the fifth dielectric layer 225.

Figure 23:
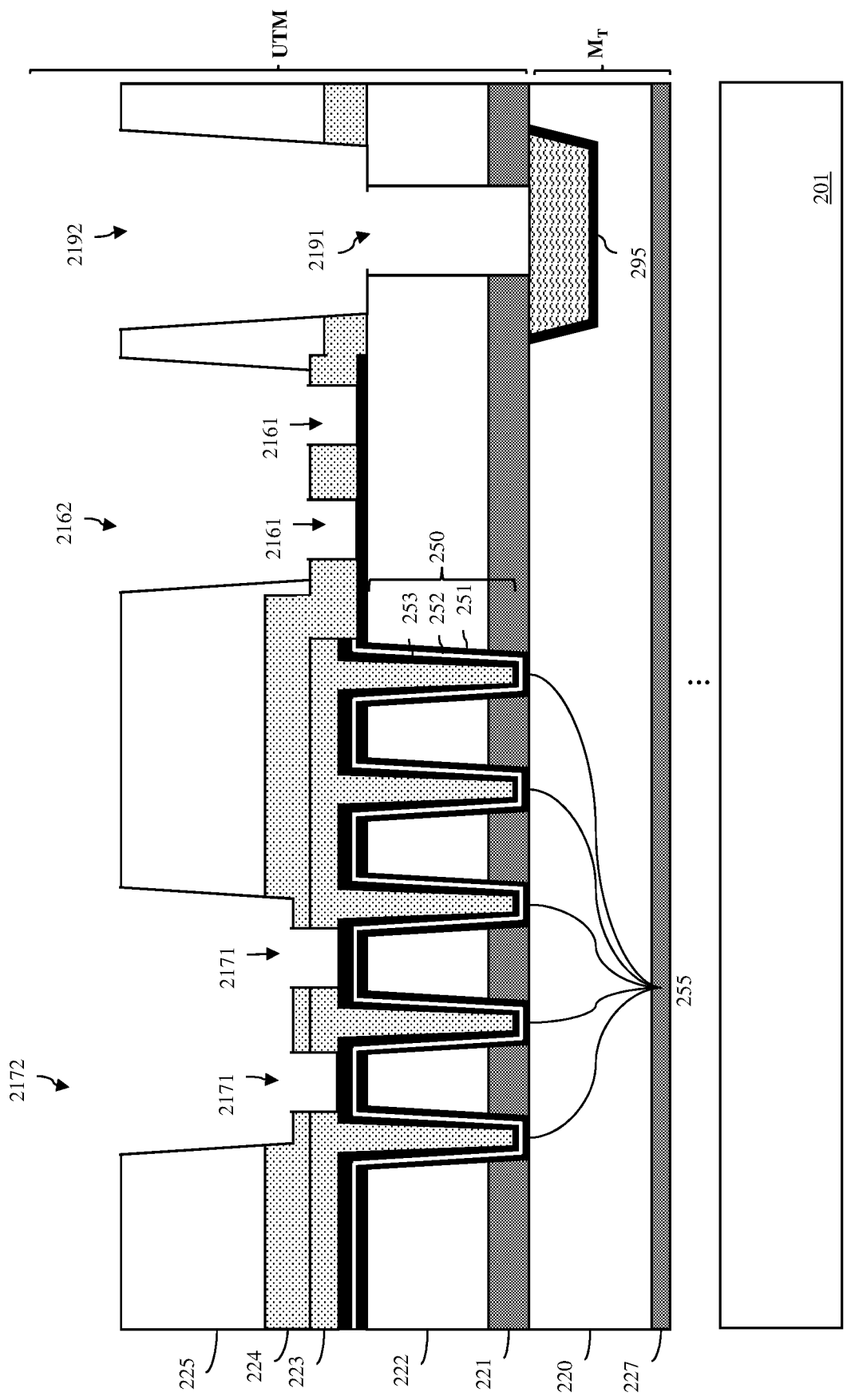

After the fifth dielectric layer 225 is deposited, wire trenches 2172, 2162 and 2192 for the dual-damascene top electrode contact, the dual-damascene bottom electrode contact and the additional dual-damascene interconnect structure can be lithographically patterned and anisotrpically etched in the fifth dielectric layer 225 and fourth dielectric layer 224 so as to be aligned above the via holes 2171, 2161, and 2191, respectively (see process step 426 and FIG. 23). Specifically, the lithographic patterning and etch processes can be performed such that a wire trench 2172 for the dual-damascene top electrode contact is aligned above the via hole(s) 2171 and extends from the top surface of the fifth dielectric layer 225 into or through the fourth dielectric layer 224. The lithographic patterning and etch processes can be performed such that a wire trench 2162 for the dual-damascene bottom electrode contact is aligned above the via hole(s) 2161 and extends from the top surface of the fifth dielectric layer 225 to the top surface of the fourth dielectric layer 224. Additionally, the lithographic patterning and etch processes can be performed such that at least one additional wire trench 2192 for the additional dual-damascene interconnect structure is aligned above the additional via hole 2191 and extends from the top surface of the fifth dielectric layer 225 to the top surface of the second dielectric layer 222. As illustrated, the etch process will be performed so that via hole(s) 2171 for the dual-damascene top electrode are further extended downward completely through the third dielectric layer 223, thereby exposing the top surface of the second conformal dielectric layer 253 (i.e., the top electrode). The etch process will also be performed so that the additional via hole 2191 for the dual-damascene interconnect structure 290 is extended downward completely through the second dielectric layer 222, thereby exposing the top surface of the additional metal element 295. It should be noted that this etch process can be selective for the silicon dioxide of the second dielectric layer 222 over the silicon nitride of the third dielectric layer 223 so that the etch rate of the silicon dioxide is faster than that of the silicon nitride. This etch process should also be highly selective for the silicon dioxide of the second dielectric layer 222 over the metal or metal alloys of the MIMCAP to prevent damage to these materials when exposed. Etch processes that are selective for silicon dioxide over silicon nitride and that are highly selective for silicon oxide over metal are well known in the art and, thus, the details of these etch processes have been omitted from the specification in order to allow the reader to focus on the salient aspects of the disclosed method.

Finally, a metallization process can be performed so as to line the wire trenches 2172, 2162, and 2192 and the via hole(s) 2171, 2161, and 2191 below with diffusion barrier and/or adhesion layers and then fill those trenches with a metal or metal alloy conductor (see process step 427 and the embodiment 200A of the IC structure shown in FIG. 2A). A polishing process (e.g., a CMP process) can then be performed so as to remove any conductive material from above the top surface of the fifth dielectric layer 225. The metallization process results in a dual-damascene top electrode contact 270 in the upper portion of the UTM level above the MIMCAP 250 with a metal wire 272 in the wire trench 2172 and via interconnect(s) 271 in the via hole(s) 2171. As illustrated, the bottom surface of the via interconnects 271 at the bottoms of the via hole(s) 2171 are in contact with the top surface of the second conformal metal layer 253.

The metallization process results in a dual-damascene bottom electrode contact 260 in the upper portion of the UTM level above the MIMCAP 250 with a metal wire 262 in the wire trench 2162 and via interconnect(s) 261 in the via hole(s) 2161. As illustrated, the bottom surface of the via interconnects 261 at the bottoms of the via hole(s) 2161 are in contact with the top surface of the first conformal metal layer 251 at the end 256 that extends laterally beyond the other MIM stack layers. The metallization process also results in an additional dual-damascene interconnect structure 290, which includes: an additional metal wire 292 in the additional wire trench 2192 and positioned laterally adjacent to the dual-damascene electrode contacts 260, 270; and an additional via interconnect 291 in the additional via hole 2191 and positioned laterally adjacent to the MIMCAP 250. As illustrated, the bottom surface of the via interconnect 291 at the bottom of the additional via hole 2191 is in contact with the top surface of the additional metal element 295.

Figure 2B:
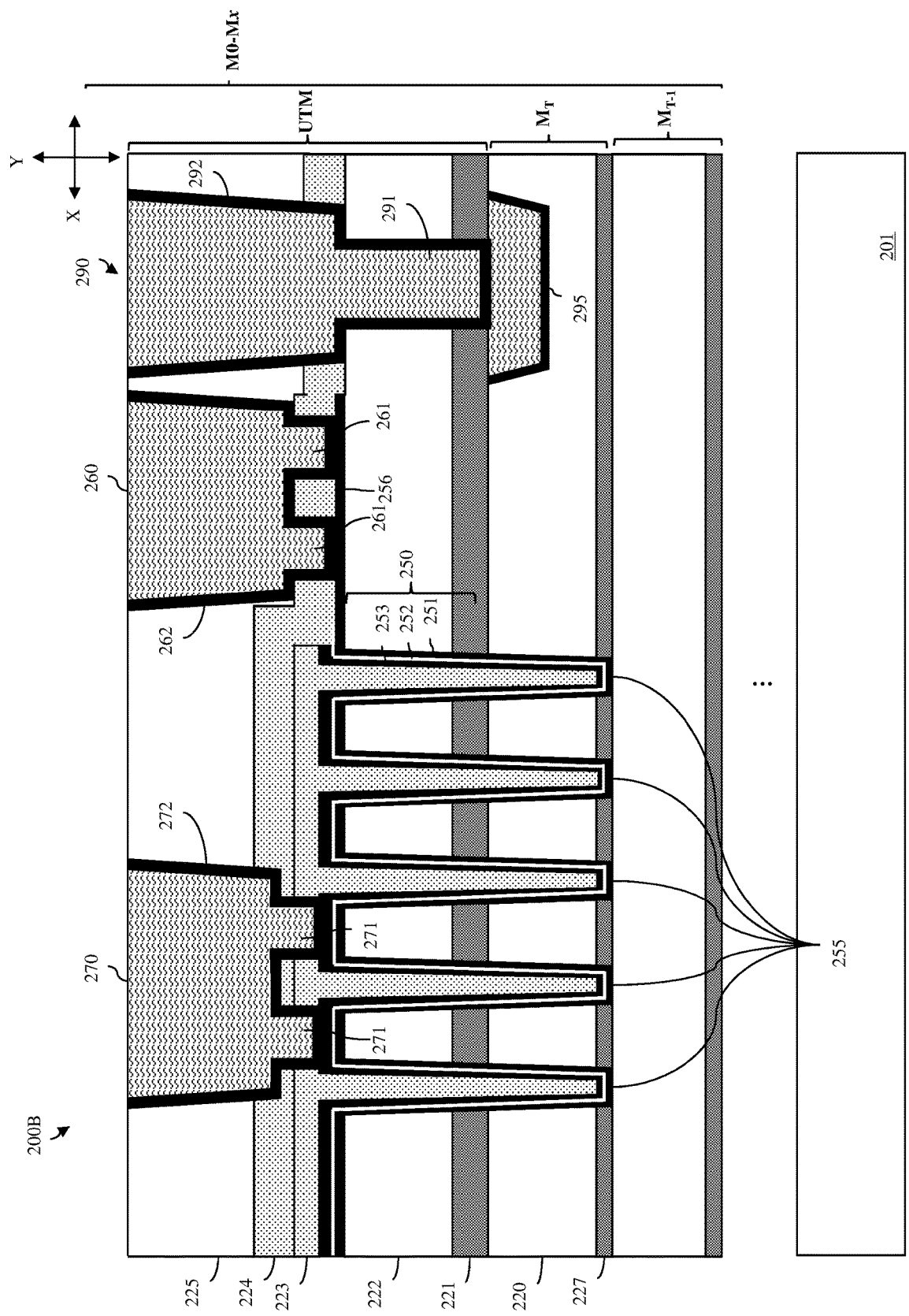
Figure 2C:
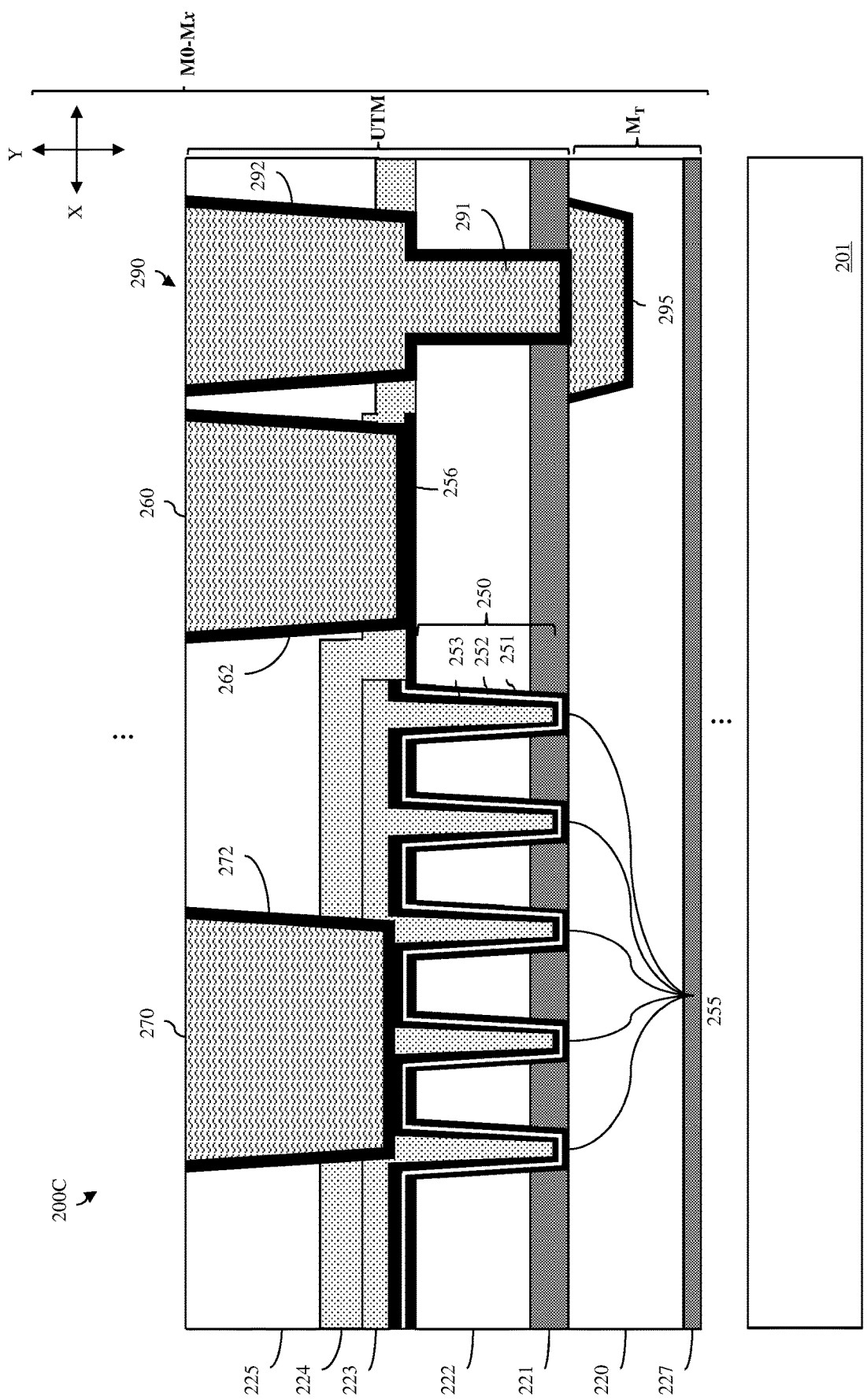

It should be understood that one or more additional and/or alternative process steps to those set forth in the flow diagram of FIG. 15 could be performed in order to form the embodiments 200B and 200C of the IC structure shown in FIGS. 2B and 2C, respectively. For example, during MIMCAP formation at process step 422, the trenches 255 can be etched so that they extend completely through the $M_T$ metal level (e.g., down to or into the $M_{T-1}$ metal level) (see FIG. 24. The remaining process steps will result in the embodiment 200B of the IC structure shown in FIG. 2B. Additionally, instead of forming the top electrode contact 270 as a dual-damascene top electrode contact and the bottom electrode contact 260 as a dual-damascene bottom electrode contact, these contacts could each be formed at process step 412 wire electrode contacts. In this case, only the via hole 2191 would be patterned and etched into the fourth dielectric layer 224 at process step 424 (see FIG. 25). Subsequently, the wire trench 2172 and wire trench 2162 would be formed at process step 426, where the wire trench 2172 extends from the top surface of the fifth dielectric layer 225 down to the bottom surface of the third dielectric layer 223, thereby exposing the top surface of the second conformal metal layer 253 and where the wire trench 2162 extends from the top surface of the fifth dielectric layer 225 down to the bottom surface of the fourth dielectric layer 224, thereby exposing the top surface of the first conformal metal layer 251 at the end 256 (see FIG. 26). In this case, metallization at process step 427 will result in wire top and bottom electrode contacts in the upper portion of the UTM level and in direct contact with the top surface of the second conformal metal layer 253 and the top surface of the first conformal metal layer 251, respectively and, thus, the embodiment 200C of the IC structure shown in FIG. 2C.

The method embodiments described above refer to various metallization process steps (e.g., to form BEOL wires and dual-damascene structures). Metallization processing is well known in the art and, thus, the details of that metallization processing has been omitted from this specification in order to allow the reader to focus on the salient aspects of the disclosed method. However, as discussed above such metallization processes typically include conformal deposition of diffusion barrier and/or adhesion layer(s) to line wire trench(es) and/or via hole(s) and deposition of a conductor and, particularly, a conductive fill material to fill the wire trench(es) and/or via hole(s). The diffusion barrier and/or adhesion layers can be any suitable material that blocks ion diffusion and/or facilitates adhesion. Such materials can include, for example, tantalum, tantalum nitride, titanium, titanium nitride, or any other suitable metal interconnect liner material. The conductor can include, for example, copper, aluminum or any other suitable BEOL metal or metal alloy. For example, in an exemplary embodiment, the above-described BEOL metal features (i.e., the electrode contacts, damascene structures, metal elements, etc.) can include a copper conductor with a tantalum nitride/tantalum liner. In another exemplary embodiment, the BEOL metal features can include an aluminum conductor with a titanium/titanium nitride liner.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising:
a substrate; and
a metal level above the substrate and comprising:
a first dielectric layer;
a second dielectric layer on the first dielectric layer;
a metal-insulator-metal capacitor comprising:
trenches extending through the second dielectric layer and the first dielectric layer; and
a metal-insulator-metal stack comprising: a first conformal metal layer on the second dielectric layer and lining the trenches; a conformal insulator layer on the first conformal metal layer; and a second conformal metal layer on the conformal insulator layer;
a third dielectric layer on the second conformal metal layer and filling the trenches;
a fourth dielectric layer comprising a conformal dielectric layer above and immediately adjacent to a top surface of the third dielectric layer and further extending laterally beyond the third dielectric layer and the metal-insulator-metal capacitor so as to be above and immediately adjacent to a top surface of the second dielectric layer;
a fifth dielectric layer on the fourth dielectric layer, wherein the fifth dielectric layer has a planar top surface, wherein a first portion of the fifth dielectric layer on the fourth dielectric layer opposite the third dielectric layer has a first thickness and wherein a second portion of the fifth dielectric layer on the fourth dielectric layer opposite the second dielectric layer has a second thickness that is greater than the first thickness; and
a top electrode contact that extends through the first portion of the fifth dielectric layer, the fourth dielectric layer and the third dielectric layer to a top surface of the second conformal metal layer.

2. The integrated circuit structure of claim 1,
wherein end walls of the first conformal metal layer, the conformal insulator layer, the second conformal metal layer and the third dielectric layer are vertically aligned,
wherein the fourth dielectric layer is positioned laterally immediately adjacent to the end walls,
wherein the integrated circuit structure further comprises a bottom electrode contact below the metal-insulator-metal capacitor, and
wherein a top surface of the bottom electrode contact is in contact with a bottom surface of the first conformal metal layer at a bottom of at least one of the trenches.

3. The integrated circuit structure of claim 2, wherein the top electrode contact comprises any one of the following:
a dual-damascene top electrode comprising: a top electrode wire extending through the first portion of the fifth dielectric layer and the fourth dielectric layer such that a bottom of the top electrode wire is immediately adjacent to a top surface of the third dielectric layer; and at least one top electrode via interconnect extending from the bottom of the top electrode wire through the third dielectric layer to the top surface of the second conformal metal layer; and
a wire top electrode contact extending through the first portion of the fifth dielectric layer, the fourth dielectric layer and the third dielectric layer to the top surface of the second conformal metal layer.

4. The integrated circuit structure of claim 1,
wherein end walls of the conformal insulator layer, the second conformal metal layer and the third dielectric layer are vertically aligned,
wherein an end portion of the first conformal metal layer extends laterally beyond the end walls of the conformal insulator layer, the second conformal metal layer, and the third dielectric layer,
wherein the fourth dielectric layer is positioned laterally immediately adjacent to the end walls and is further above and immediately adjacent to a top surface of the end portion of the first conformal metal layer,
wherein a third portion of the fifth dielectric layer on the fourth dielectric layer opposite the end portion of the first conformal metal layer has a third thickness that is between the first thickness and the second thickness,
wherein the metal level further comprises a dual-damascene bottom electrode contact comprising: a bottom electrode wire extending through the third portion of the fifth dielectric layer such that top surfaces of the bottom electrode wire and the fifth dielectric layer are coplanar and such that a bottom of the bottom electrode wire is adjacent to a top surface of the fourth dielectric layer; and at least one bottom electrode via interconnect extending from the bottom of the bottom electrode wire to the top surface of the end portion of the first conformal metal layer.

5. The integrated circuit structure of claim 1, wherein the metal level further comprises:
an additional dual-damascene interconnect structure comprising: an additional wire extending through the second portion of the fifth dielectric layer and the fourth dielectric layer such that a bottom of the additional wire is immediately adjacent to the top surface of the second dielectric layer; and at least one additional via interconnect extending from the bottom of the additional wire through the second dielectric layer and the first dielectric layer.

6. The integrated circuit structure of claim 5, further comprising a metal element below and contacted by the additional dual-damascene interconnect structure.

7. The integrated circuit structure of claim 1, wherein the trenches further extend through at least one additional dielectric layer below the first dielectric layer.

8. The integrated circuit structure of claim 1, wherein the metal level is a back-end-of-the-line metal level having a thickness of at least 3 µm.

9. An integrated circuit structure comprising:
a substrate; and
a metal level above the substrate and comprising:
a first dielectric layer;
a second dielectric layer on the first dielectric layer;
a metal-insulator-metal capacitor comprising:
trenches extending through the second dielectric layer and the first dielectric layer; and
a metal-insulator-metal stack comprising: a first conformal metal layer on the second dielectric layer and lining the trenches; a conformal insulator layer on the first conformal metal layer; and a second conformal metal layer on the conformal insulator layer;
a third dielectric layer on the second conformal metal layer and filling the trenches, wherein end walls of the conformal insulator layer, the second conformal metal layer and the third dielectric layer are vertically aligned and wherein an end portion of the first conformal metal layer extends laterally beyond the end walls;
a fourth dielectric layer comprising a conformal dielectric layer above and immediately adjacent to a top surface of the third dielectric layer, positioned laterally immediately adjacent to the end walls, above and immediately adjacent to a top surface of the the end portion of the first conformal metal layer and further extending laterally beyond the metal-insulator-metal capacitor and onto a top surface of the second dielectric layer;
a fifth dielectric layer on the fourth dielectric layer, wherein the fifth dielectric layer has a planar top surface, wherein a first portion of the fifth dielectric layer on the fourth dielectric layer opposite the third dielectric layer has a first thickness, wherein a second portion of the fifth dielectric layer on the fourth dielectric layer opposite the second dielectric layer has a second thickness that is greater than the first thickness, and wherein a third portion of the fifth dielectric layer on the fourth dielectric layer opposite the end portion of the first conformal metal layer has a third thickness that is between the first thickness and the second thickness;
a top electrode contact extending through the first portion of the fifth dielectric layer, the fourth dielectric layer, and third dielectric layer to a top surface of the second conformal metal layer; and
a bottom electrode contact extending through the third portion of the fifth dielectric layer and the fourth dielectric layer to the top surface of the end portion of the first conformal metal layer, wherein top surfaces of the top electrode contact, the bottom electrode contact and the fifth dielectric layer are coplanar.

10. The integrated circuit structure of claim 9, wherein the metal level further comprises:
an additional dual-damascene interconnect structure comprising: an additional wire extending through the second portion of the fifth dielectric layer and the fourth dielectric layer such that a bottom of the additional wire is adjacent to the top surface of the second dielectric layer; and at least one additional via interconnect extending from the bottom of the additional wire through the second dielectric layer and the first dielectric layer to a metal element.

11. The integrated circuit structure of claim 10, wherein top surfaces of the fifth dielectric layer, the top electrode contact, the bottom electrode contact and the additional dual-damascene interconnect structure are co-planar.

12. The integrated circuit structure of claim 10, wherein the metal element comprises a metal wire.

13. The integrated circuit structure of claim 9, wherein the trenches further extend through at least one additional dielectric layer below the first dielectric layer.

14. The integrated circuit structure of claim 9, wherein the metal level is a back-end-of-the-line metal level having a thickness of at least 3 µm.

15. An integrated circuit structure comprising:
a substrate; and
a metal level above the substrate and comprising:
a first dielectric layer;

a second dielectric layer on the first dielectric layer;
a metal-insulator-metal capacitor comprising:
 trenches extending through the second dielectric layer and the first dielectric layer; and
  a metal-insulator-metal stack comprising: a first conformal metal layer on the second dielectric layer and lining the trenches; a conformal insulator layer on the first conformal metal layer; and a second conformal metal layer on the conformal insulator layer;
a third dielectric layer on the second conformal metal layer and filling the trenches, wherein end walls of the conformal insulator layer, the second conformal metal layer and the third dielectric layer are vertically aligned and wherein an end portion of the first conformal metal layer extends laterally beyond the end walls;
a fourth dielectric layer comprising a conformal dielectric layer above and immediately adjacent to a top surface of the third dielectric layer, positioned laterally immediately adjacent to the end walls, above and immediately adjacent to a top surface of the end portion of the first conformal metal layer and further extending laterally beyond the metal-insulator-metal capacitor onto a top surface of the second dielectric layer;
a fifth dielectric layer on the fourth dielectric layer, wherein the fifth dielectric layer has a planar top surface, wherein a first portion of the fifth dielectric layer on the fourth dielectric layer opposite the third dielectric layer has a first thickness, wherein a second portion of the fifth dielectric layer on the fourth dielectric layer opposite the second dielectric layer has a second thickness that is greater than the first thickness, and wherein a third portion of the fifth dielectric layer on the fourth dielectric layer opposite the end portion of the first conformal metal layer has a third thickness that is between the first thickness and the second thickness;
a dual-damascene top electrode contact comprising: a top electrode wire extending through the first portion of the fifth dielectric layer and into an upper portion of the fourth dielectric layer such that a bottom of the top electrode wire is above and physically separated from the top surface of the third dielectric layer; and at least one top electrode via interconnect extending from the bottom of the top electrode wire through a lower portion of the fourth dielectric layer and further through the third dielectric layer to a top surface of the second conformal metal layer; and
a dual-damascene bottom electrode contact comprising: a bottom electrode wire extending through the third portion of the fifth dielectric layer such that a bottom of the bottom electrode wire is adjacent to a top surface of the fourth dielectric layer; and at least one bottom electrode via interconnect extending from the bottom of the bottom electrode wire through the fourth dielectric layer to the top surface of the end portion of the first conformal metal layer, wherein top surfaces of the dual-damascene top electrode contact, the dual-damascene bottom electrode contact and the fifth dielectric layer are coplanar.

16. The integrated circuit structure of claim 15, wherein the metal level further comprises:
an additional dual-damascene interconnect structure comprising: an additional wire extending through the second portion of the fifth dielectric layer and the fourth dielectric layer such that a bottom of the additional wire is adjacent to the top surface of the second dielectric layer; and at least one additional via interconnect extending from the bottom of the additional wire through the second dielectric layer and the first dielectric layer to a metal element.

17. The integrated circuit structure of claim 16, wherein top surfaces of the fifth dielectric layer, the dual-damascene top electrode contact, the dual-damascene bottom electrode contact and the additional dual-damascene interconnect structure are co-planar.

18. The integrated circuit structure of claim 16, wherein bottoms of the top electrode wire, the bottom electrode wire and the additional wire are all at different levels such that a height of the additional wire is greater than a height of the bottom electrode wire and the height of the bottom electrode wire is greater than a height of the top electrode wire.

19. The integrated circuit structure of claim 16, wherein the metal element comprises a metal wire.

20. The integrated circuit structure of claim 15, wherein the trenches further extend through at least one additional dielectric layer below the first dielectric layer.

21. The integrated circuit structure of claim 15, wherein the metal level is a back-end-of-the-line metal level having a thickness of at least 3 μm.

* * * * *